United States Patent
Wang et al.

(10) Patent No.: US 12,538,662 B2
(45) Date of Patent: Jan. 27, 2026

(54) ARRAY SUBSTRATE AND DISPLAY APPARATUS

(71) Applicant: BOE Technology Group Co., Ltd., Beijing (CN)

(72) Inventors: Tao Wang, Beijing (CN); Mengyang Wen, Beijing (CN); Ziyu Zhang, Beijing (CN); Tao Sun, Beijing (CN); Yue Cui, Beijing (CN); Chengjie Qin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 448 days.

(21) Appl. No.: 18/004,900

(22) PCT Filed: Feb. 21, 2022

(86) PCT No.: PCT/CN2022/077005
§ 371 (c)(1),
(2) Date: Jan. 10, 2023

(87) PCT Pub. No.: WO2023/155184
PCT Pub. Date: Aug. 24, 2023

(65) Prior Publication Data
US 2024/0276771 A1    Aug. 15, 2024

(51) Int. Cl.
*H10K 59/122*    (2023.01)
*H10K 59/35*    (2023.01)

(52) U.S. Cl.
CPC ......... *H10K 59/122* (2023.02); *H10K 59/353* (2023.02)

(58) Field of Classification Search
None
See application file for complete search history.

(56) References Cited

U.S. PATENT DOCUMENTS

| 11,456,430 B2* | 9/2022 | Kim | .................... | H10K 59/8723 |
| 11,693,508 B2* | 7/2023 | Lee | ........................ | H10K 59/40 345/174 |

(Continued)

FOREIGN PATENT DOCUMENTS

| CN | 102496683 A | 6/2012 |
| CN | 104282717 A | 1/2015 |

(Continued)

OTHER PUBLICATIONS

International Search Report & Written Opinion mailed Nov. 29, 2022, regarding PCT/CN2022/077005.

*Primary Examiner* — Michelle Mandala
(74) *Attorney, Agent, or Firm* — Intellectual Valley Law, P.C.

(57) ABSTRACT

An array substrate is provided. The array substrate includes a base substrate; an auxiliary structure in an inter-subpixel region and on the base substrate; and a cathode layer on a side of the auxiliary structure away from the base substrate. The auxiliary structure includes a plurality of groups of auxiliary blocks, a respective group of the plurality of groups of auxiliary blocks including one or more auxiliary blocks protruding away from the base substrate. The plurality of groups of auxiliary blocks are configured to enhance adhesion between an organic layer and an adjacent layer and reduce or eliminate interlayer peeling therebetween.

19 Claims, 21 Drawing Sheets

(56) References Cited

U.S. PATENT DOCUMENTS

| | | | |
|---|---|---|---|
| 11,886,674 B2* | 1/2024 | Lee | G06F 3/0412 |
| 2002/0057054 A1 | 5/2002 | Chung et al. | |
| 2013/0099658 A1 | 4/2013 | Tsai et al. | |
| 2015/0008820 A1 | 1/2015 | Lee | |
| 2017/0025486 A1 | 1/2017 | Kwon | |
| 2018/0033848 A1 | 2/2018 | Jung et al. | |
| 2020/0091257 A1 | 3/2020 | Sun et al. | |
| 2022/0123074 A1* | 4/2022 | Zhang | H10K 59/1315 |
| 2022/0158137 A1 | 5/2022 | Chen | |
| 2022/0416202 A1 | 12/2022 | Wang et al. | |
| 2024/0016004 A1* | 1/2024 | Song | H10K 59/873 |

FOREIGN PATENT DOCUMENTS

| | | |
|---|---|---|
| CN | 108777258 A | 11/2018 |
| CN | 208622729 U | 3/2019 |
| CN | 110289294 A | 9/2019 |
| CN | 112310318 A | 2/2021 |
| CN | 112420959 A | 2/2021 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/077005, filed Feb. 21, 2022, the contents of which are incorporated by reference in the entirety.

TECHNICAL FIELD

The present invention relates to display technology, more particularly, to an array substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present disclosure provides an array substrate, comprising a base substrate; an auxiliary structure in an inter-subpixel region and on the base substrate; and a cathode layer on a side of the auxiliary structure away from the base substrate; wherein the auxiliary structure comprises a plurality of groups of auxiliary blocks, a respective group of the plurality of groups of auxiliary blocks comprising one or more auxiliary blocks protruding away from the base substrate; and the plurality of groups of auxiliary blocks are configured to enhance adhesion between an organic layer and an adjacent layer and reduce or eliminate interlayer peeling therebetween.

Optionally, the cathode layer comprises a plurality of groups of protrusions in the inter-subpixel region, a respective group of the plurality of groups of protrusions comprising one or more protrusions protruding away from the base substrate.

Optionally, the respective group of the plurality of groups of protrusions is on a side of the respective group of the plurality of groups of auxiliary blocks away from the base substrate; and an orthographic projection of the respective group of the plurality of groups of protrusions on the base substrate at least partially overlaps with an orthographic projection of the respective group of the plurality of groups of auxiliary blocks on the base substrate.

Optionally, the one or more auxiliary blocks in the respective group of the plurality of groups of auxiliary blocks have a conforming shape.

Optionally, a width of a respective auxiliary block, along a direction crossing over the respective auxiliary block, decreases from a side away from the base substrate to a side closer to the base substrate.

Optionally, a lateral side of a respective auxiliary block has a slope angle with respect to a layer in contact with the respective auxiliary block in a range of 60 degrees to 80 degrees.

Optionally, the array substrate further comprises a common organic layer on a side of the auxiliary structure away from the base substrate; the common organic layer comprises a first part, a second part on a side of a respective auxiliary block away from the base substrate, and a third part; the second part is at least partially segregated from the first part and the third part.

Optionally, the plurality of groups of auxiliary blocks are arranged in columns and rows; groups of auxiliary blocks in adjacent rows are staggered; and groups of auxiliary blocks in adjacent columns are staggered.

Optionally, shapes of auxiliary blocks respectively in adjacent groups of auxiliary blocks in a same row are curved toward different directions; and in a same column of groups of auxiliary blocks, shapes of auxiliary blocks respectively in adjacent groups of auxiliary blocks in the same column are curved toward a same direction.

Optionally, shapes of auxiliary blocks in the auxiliary structure are curved toward a same direction.

Optionally, auxiliary blocks of the auxiliary structure have a longitudinal shape; longitudinal directions of the auxiliary blocks are substantially parallel to one of a first direction and a second direction, but not to the other one of the first direction and the second direction, the first direction and the second direction being different directions.

Optionally, the array substrate further comprises a plurality of anodes comprising an anode of a first type, an anode of a second type, and an anode of a third type, having different shapes; at least a first subpixel region corresponding to the anode of the first type and a second subpixel region corresponding to the anode of the second type have an elongated shape; and the plurality of groups of auxiliary blocks are absent between longitudinal sides of the first subpixel region and the second subpixel region adjacent to each other.

Optionally, extension directions of auxiliary blocks of the auxiliary structure are substantially perpendicular to the longitudinal sides of the first subpixel region and the second subpixel region.

Optionally, the array substrate further comprises a plurality of anodes comprising an anode of a first type, an anode of a second type, and an anode of a third type, having different shapes; at least a first subpixel region corresponding to the anode of the first type and a second subpixel region corresponding to the anode of the second type have an elongated shape; and the plurality of groups of auxiliary blocks are present between longitudinal sides of the first subpixel region and the second subpixel region adjacent to each other.

Optionally, extension directions of auxiliary blocks of the auxiliary structure are substantially parallel to the longitudinal sides of the first subpixel region and the second subpixel region.

Optionally, the array substrate further comprises a plurality of anodes; wherein an orthographic projection of a respective group of the plurality of groups of auxiliary blocks on a base substrate at least partially overlaps with orthographic projection of an anode on the base substrate.

Optionally, the array substrate further comprises a pixel definition layer; wherein the plurality of groups of auxiliary blocks are on a side of the pixel definition layer away from the base substrate.

Optionally, the array substrate further comprises a plurality of spacers on side of the pixel definition layer away from the base substrate; an orthographic projection of the plurality of groups of auxiliary blocks on the base substrate is non-overlapping with an orthographic projection of the plurality of spacers on the base substrate.

Optionally, the array substrate is a bendable array substrate configured to be bent along a bending direction; auxiliary blocks in the auxiliary structure are arranged in a plurality of columns; auxiliary blocks in a respective column of the plurality of columns are arranged in a direction substantially parallel to the bending direction; and an extension direction of each auxiliary block is substantially perpendicular to the bending direction.

In another aspect, the present disclosure provides a display apparatus, comprising the array substrate described herein or fabricated by a method described herein, and one or more integrated circuits connected to the array substrate

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a base substrate; an auxiliary structure in an inter-subpixel region and on the base substrate; and a cathode layer on a side of the auxiliary structure away from the base substrate. Optionally, the auxiliary structure comprises a plurality of groups of auxiliary blocks. A respective group of the plurality of groups of auxiliary blocks comprising one or more auxiliary blocks protruding away from the base substrate.

Figure 1:
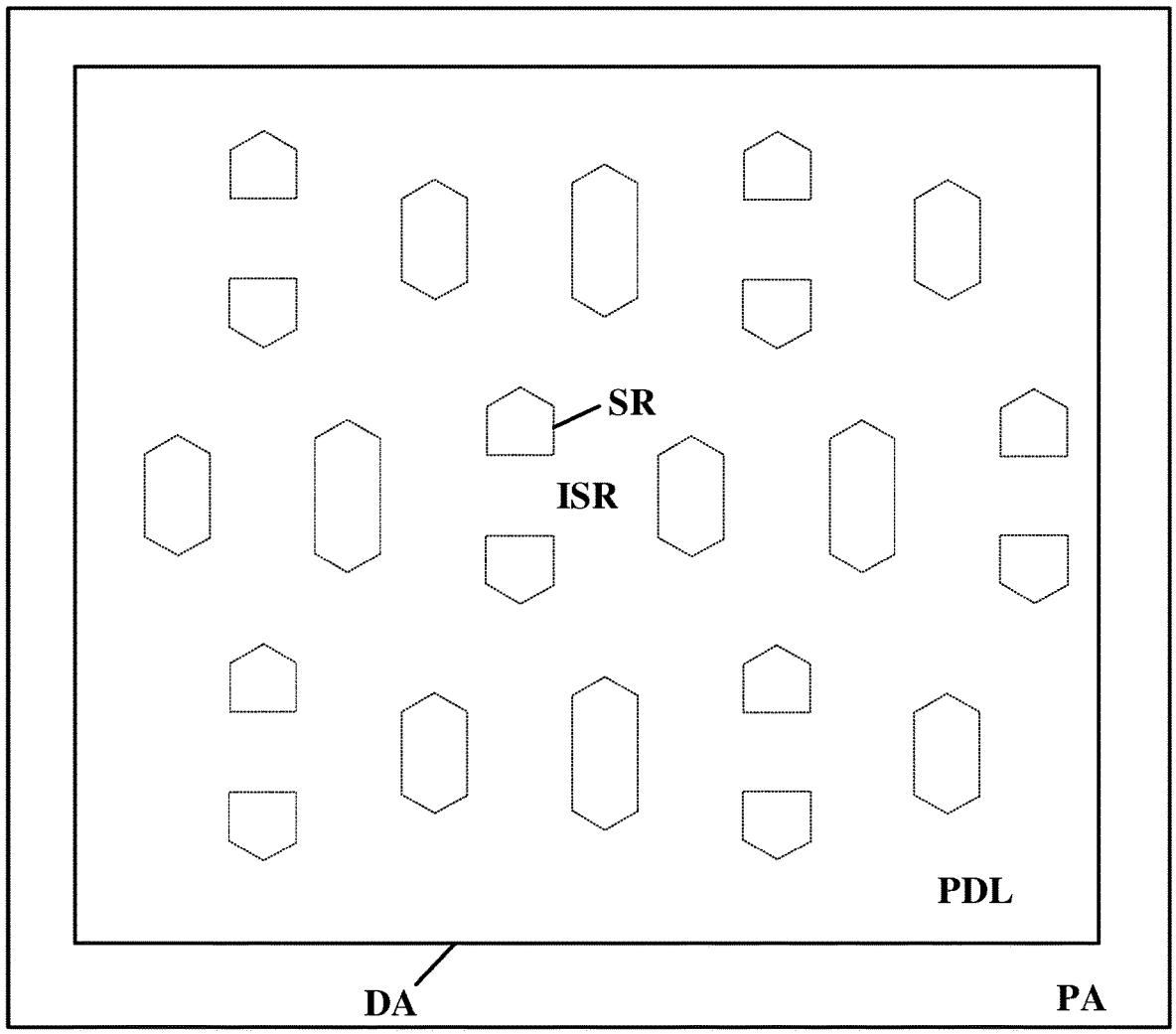
FIG. 1 is a schematic diagram illustrating a plurality of subpixel regions and an inter-subpixel region in an array substrate in some embodiments according to the present disclosure.

FIG. 1 is a schematic diagram illustrating a plurality of subpixel regions and an inter-subpixel region in an array substrate in some embodiments according to the present disclosure. Referring to FIG. 1, the array substrate in some embodiments includes a plurality of subpixel regions SR, for example, defined by a pixel definition layer PDL; and an inter-subpixel region ISR. The inter-subpixel region ISR refers to a region in a display region of the array substrate but outside the plurality of sub-pixel regions SR. For example, the display region includes the plurality of subpixel regions SR and the inter-subpixel region ISR. As used herein, a subpixel region refers to a light emission region of a subpixel, such as a region corresponding to a light emissive layer in a light emitting diode display panel or a quantum dots display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a pixel definition layer in a light emitting diode display panel or a quantum dots display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 2:
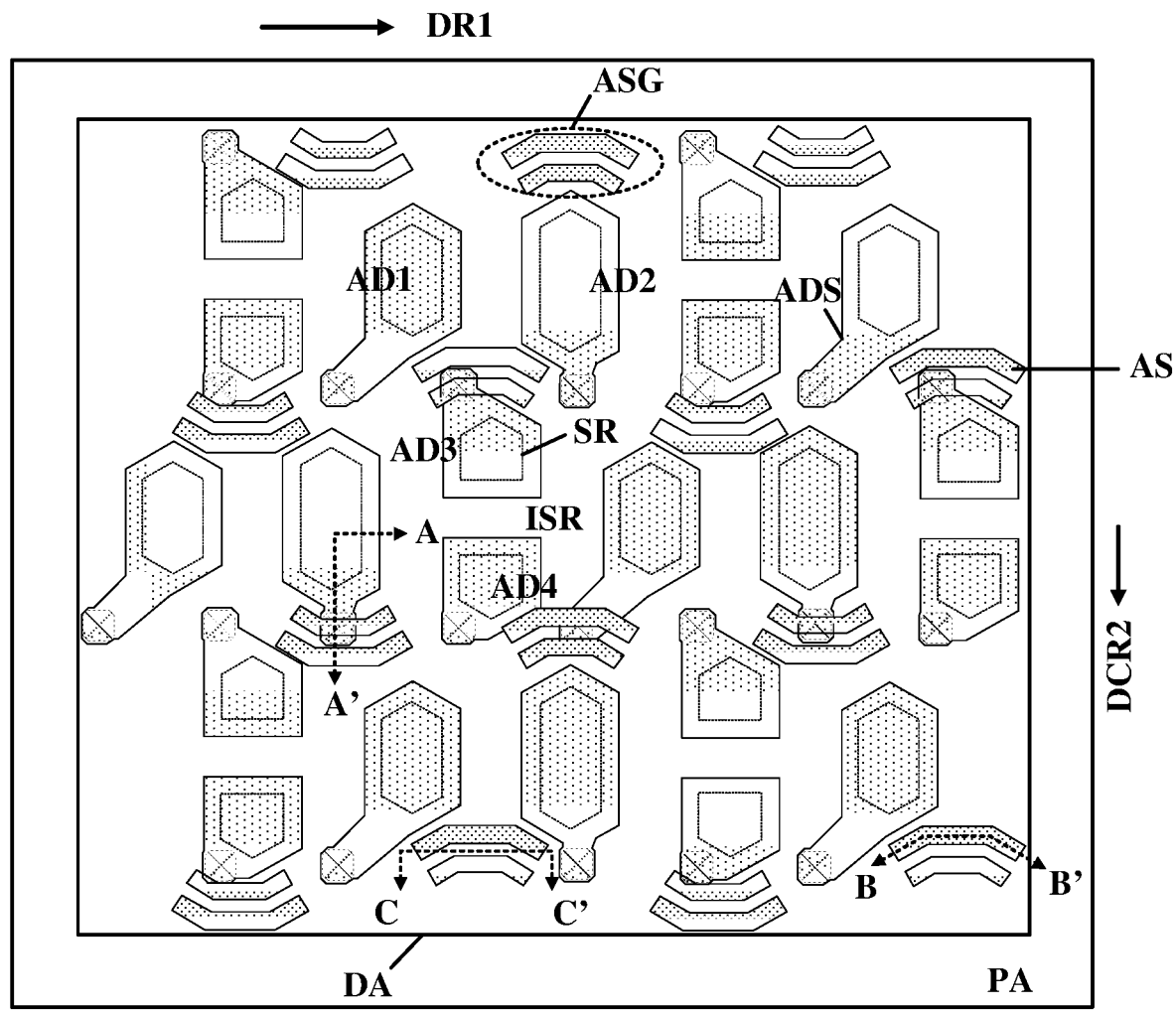
FIG. 2 is a schematic diagram illustrating the structure of an array substrate in some embodiments according to the present disclosure.

FIG. 2 is a schematic diagram illustrating the structure of an array substrate in some embodiments according to the present disclosure. Various appropriate anode arrangement may be implemented in the present array substrate. FIG. 2 shows an exemplary anode arrangement in an array substrate according to the present disclosure. Referring to FIG. 2, the array substrate includes a plurality of anodes ADS. FIG. 2 depicts the relative position between a respective anode and a respective subpixel region. In the specific example depicted in FIG. 2, the respective anode covers an area of the respective subpixel region.

As shown in FIG. 2, the array substrate in some embodiments further includes an auxiliary structure AS. Referring to FIG. 1 and FIG. 2, the array substrate in some embodiments includes a display area DA and a peripheral area PA. As used herein, the term "display area" refers to an area of an array substrate in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. As used herein the term "peripheral area" refers to an area of an array substrate in a display panel where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display areas. As shown in FIG. 2, the auxiliary structure AS is at least partially in the display area DA. Optionally, the auxiliary structure AS is limited in the display area DA.

Figure 3:
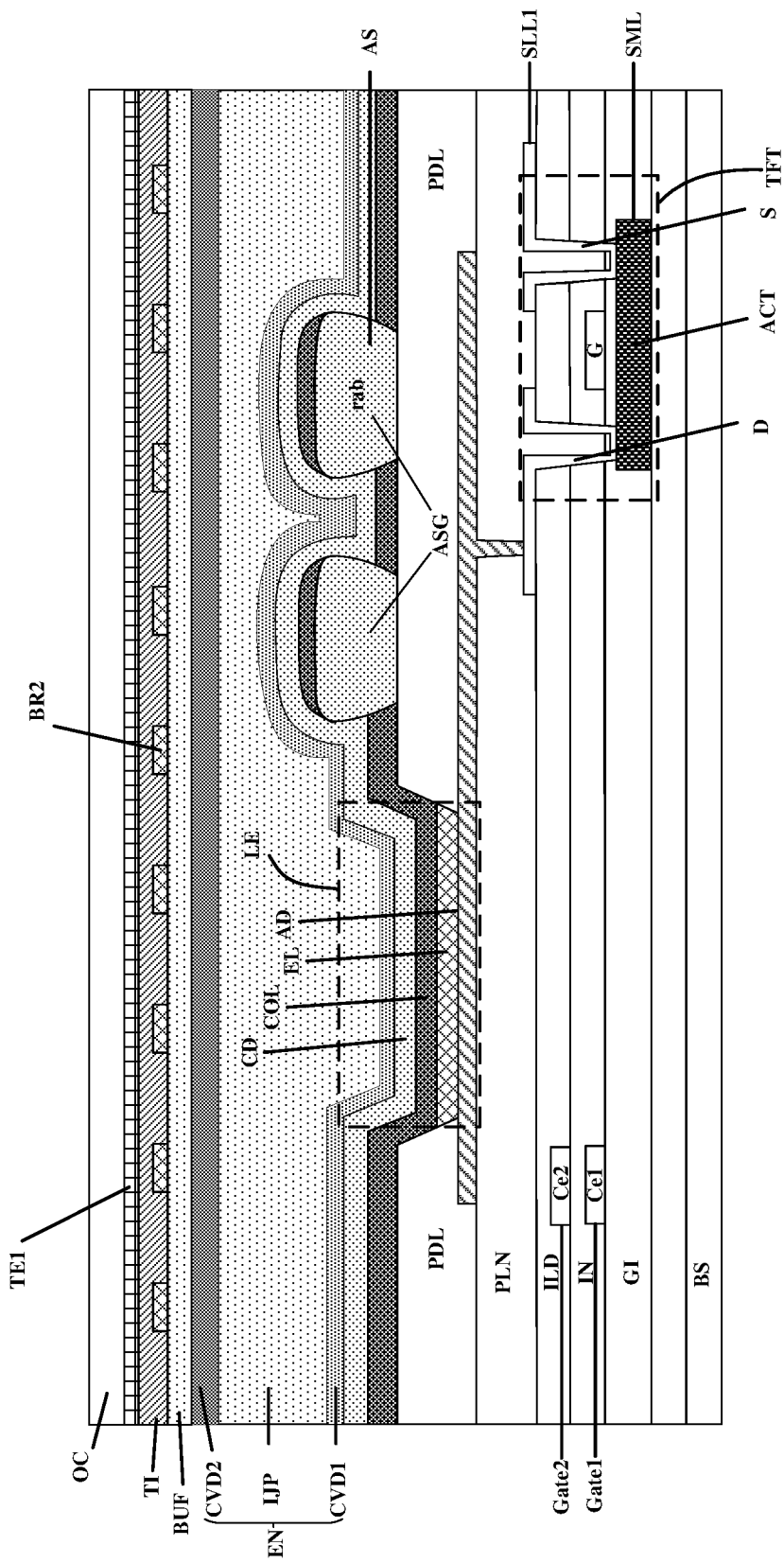
FIG. 3 is a cross-sectional view along an A-A' line in FIG. 2.

FIG. 3 is a cross-sectional view along an A-A' line in FIG. 2. Referring to FIG. 3, the array substrate in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a planarization layer PLN on a side of the source electrode S and the drain electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a common organic layer COL on a side of the light emitting layer EL away from the anode AD; and a cathode layer CD on a side of the common organic layer COL away from the light emitting layer EL. The array substrate in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer UP on a side of the first inorganic encapsulating sub-layer CVD1 away from the base substrate BS, and a second inorganic encapsulating sub-layer CVD2 on a side of the organic encapsulating sub-layer UP away from the first inorganic encapsulating sub-layer CVD1. The array substrate in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Referring to FIG. 3 again, the array substrate in some embodiments further includes an auxiliary structure AS underneath at least the cathode layer CD, optionally also underneath at least one organic layer (e.g., the common organic layer COL depicted in FIG. 3). The common organic layer COL is a unitary organic material layer extending across the plurality of subpixel regions and the inter-subpixel region. Examples of common organic layers include a charge generating layer.

The inventors of the present disclosure discover that, in related array substrates, organic layers such as the light emitting layer and the charge generating layer have relatively weak adhesion with respect to adjacent layers (e.g., an underlying layer or a layer covering the organic layer), due to the properties of the organic material and the deposition process for the organic layers. The inventors of the present disclosure discover that, in related array substrates, interlayer peeling frequently occurs between an organic layer and an adjacent layer, particularly in a region of a flexible display panel where the flexible display panel is subject to folding or bending. The inventors of the present disclosure discover that, surprisingly and unexpectedly, by having an auxiliary structure according to the present disclosure, the interlayer peeling defects can be substantially reduced or eliminated.

Referring to FIG. 2 and FIG. 3, the auxiliary structure AS in some embodiments includes a plurality of groups of auxiliary blocks ASG in the inter-subpixel region ISR. A respective group of the plurality of groups of auxiliary blocks ASG is between two or more subpixel regions. By having a plurality of groups of auxiliary blocks ASG throughout the array substrate, propagation of inter-layer peeling can be effectively prevented, even if a localized peeling occurs in a portion of the array substrate.

In some embodiments, the respective group of the plurality of groups of auxiliary blocks ASG includes one or more auxiliary blocks. FIG. 2 shows an example in which each group of the plurality of groups of auxiliary blocks ASG includes two auxiliary blocks. In one example, the one or more auxiliary blocks in the respective group of the plurality of groups of auxiliary blocks ASG have a conforming shape, for example, extension directions of the one or more auxiliary blocks in a same group are substantially parallel to each other, overall shapes of the one or more auxiliary blocks in the same group are substantially the same. The one or more auxiliary blocks in the same group may have different sizes, for example, the one or more auxiliary blocks in the same group may occupy different areas or have different thicknesses or widths. As used herein, the term "substantially parallel" means that an angle is in the range of 0 degree to approximately 30 degrees, e.g., 0 degree to approximately 5 degrees, 5 degree to approximately 10 degrees, 10 degree to approximately 15 degrees, 15 degree to approximately 20 degrees, 20 degree to approximately 25 degrees, or 25 degree to approximately 30 degrees. It is understood that the upper and lower limits are approximate and are not limited to an expressly recited value.

Figure 4:
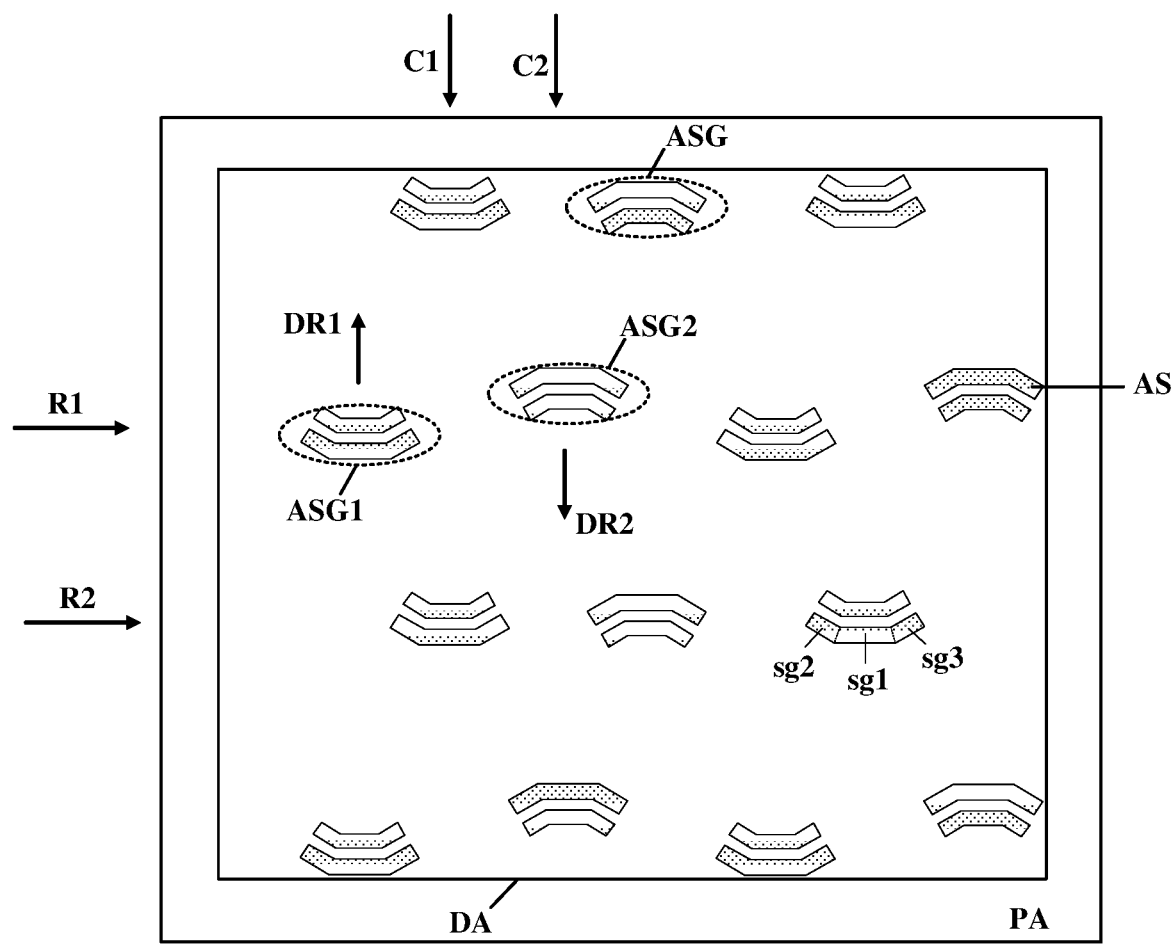
FIG. 4 depicts an arrangement of groups of auxiliary blocks in an array substrate in some embodiments according to the present disclosure.

In some embodiments, the plurality of groups of auxiliary blocks ASG are arranged in a pattern, for example, a repeating pattern. Various appropriate arrangements of the plurality of groups of auxiliary blocks ASG may be implemented based on specific subpixel arrangements in the array sub state. FIG. 4 depicts an arrangement of groups of auxiliary blocks in an array substrate in some embodiments according to the present disclosure. Referring to FIG. 4, in one example, groups of auxiliary blocks in adjacent rows (e.g., R1 and R2) are staggered. In another example, groups of auxiliary blocks in adjacent columns (e.g., C1 and C2) are staggered.

In another example, in a same row of groups of auxiliary blocks, shapes of auxiliary blocks respectively in adjacent groups of auxiliary blocks in the same row (e.g., ASG1 and ASG2) are curved toward different directions. As shown in FIG. 4, shapes of auxiliary blocks in a first adjacent group of auxiliary blocks ASG1 are curved toward a first curved direction DCR1, shapes of auxiliary blocks in a second adjacent group of auxiliary blocks ASG2 are curved toward a second curved direction DCR2. Optionally, the first curved direction DCR1 and the second curved direction DCR2 are opposite to each other.

As used herein, the term "curved toward" in the context of a shape of an auxiliary block means that the auxiliary block includes multiple segments and a reference segment, extension directions of the multiple segments are different from an extension direction of the reference segment, and that the multiple segments extend away from the reference segment toward a same side with respect to the extension direction of the reference segment. Referring to FIG. 4, an individual auxiliary block includes a first segment sg1, a second segment sg2, and a third segment sg3. Extension directions of the second segment sg2 and the third segment sg3 are different from the extension direction of the first segment sg1. The second segment sg2 and the third segment sg3 extend away from the first segment sg1 toward a same side with respect to the extension direction of the first segment sg1.

In another example, in a same column of groups of auxiliary blocks, shapes of auxiliary blocks respectively in adjacent groups of auxiliary blocks in the same column are curved toward a same direction.

In some embodiments, auxiliary blocks of the auxiliary structure have a longitudinal shape. Longitudinal directions of the auxiliary blocks are substantially parallel to one of a first direction DR1 and a second direction DR2, but not to the other one of the first direction DR1 and the second direction DR2, the first direction DR1 and the second direction DR2 being different directions. Referring to FIG. 2, the longitudinal directions of the auxiliary blocks are substantially parallel to the first direction DR1, but not to the second direction DR2.

In one example, the plurality of anodes ADS include an anode of a first type AD1, an anode of a second type AD2, and an anode of a third type AD3 having different shapes. In one example, the anode of the first type AD1 is an anode for a subpixel of a first color (e.g., red), the anode of the second type AD2 is an anode for a subpixel of a second color (e.g., blue), and the anode of the third type AD3 is an anode for a subpixel of a third color (e.g., green). Optionally, the plurality of anodes ADS further includes an anode of a fourth type AD4. Optionally, the anode of the fourth type AD4 is an anode for a subpixel of the third color (e.g., green). Optionally, the anode of the first type AD1, the anode of the second type AD2, the anode of the third type AD3, and the anode of the fourth type AD4 have different shapes.

In one example depicted in FIG. 2, at least the anode of the first type AD1 and the anode of the second type AD2 have an elongated shape. The plurality of groups of auxiliary blocks ASG are absent between longitudinal sides of the anode of the first type AD1 and the anode of the second type AD2 adjacent to each other. Optionally, the longitudinal sides of the anode of the first type AD1 and the anode of the second type AD2 adjacent to each other are substantially parallel to each other. Extension directions of the auxiliary blocks are substantially perpendicular to the longitudinal sides of the anode of the first type AD1 and the anode of the second type AD2. As used herein, the term "substantially perpendicular" means that an angle is in the range of approximately 60 degrees to approximately 120 degrees, e.g., 60 degrees to 65 degrees, 65 degrees to 70 degrees, 70 degrees to 75 degrees, 75 degrees to 80 degrees, 80 degrees to 85 degrees, 85 degrees to 90 degrees, 95 degrees to 100 degrees, 100 degrees to 105 degrees, 105 degrees to 110 degrees, 110 degrees to 115 degrees, or 115 degrees to 120 degrees. It is understood that the upper and lower limits are approximate and are not limited to an expressly recited value.

In some embodiments, at least a first subpixel region corresponding to the anode of the first type AD1 and a second subpixel region corresponding to the anode of the second type AD2 have an elongated shape. The plurality of groups of auxiliary blocks are absent between longitudinal sides of the first subpixel region and the second subpixel region adjacent to each other. Optionally, extension directions of auxiliary blocks of the auxiliary structure are substantially perpendicular to the longitudinal sides of the first subpixel region and the second subpixel region.

Referring to FIG. 2 and FIG. 3, in some embodiments, an orthographic projection of a respective group of the plurality of groups of auxiliary blocks ASG on a base substrate BS at least partially overlaps with orthographic projection of an anode AD on the base substrate BS.

Referring to FIG. 3, in some embodiments, the auxiliary structure AS is on a side of the pixel definition layer PDL away from the base substrate BS.

Figure 5A:
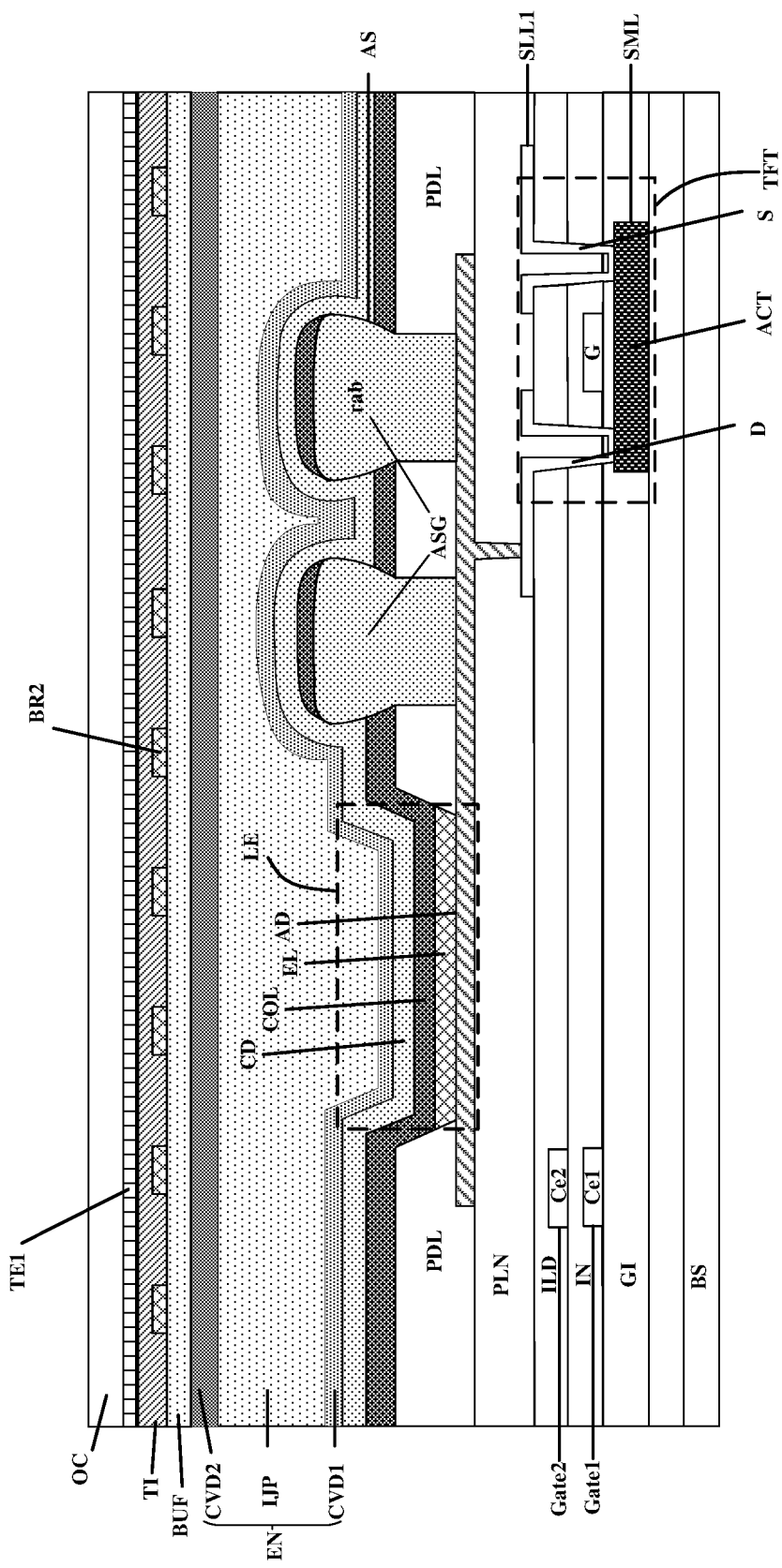
FIG. 5A is a cross-sectional view of an array substrate in some embodiments according to the present disclosure.

FIG. 5A is a cross-sectional view of an array substrate in some embodiments according to the present disclosure. Referring to FIG. 5A, in some embodiments, the auxiliary structure AS is in a same layer as the pixel definition layer PDL.

Figure 5B:
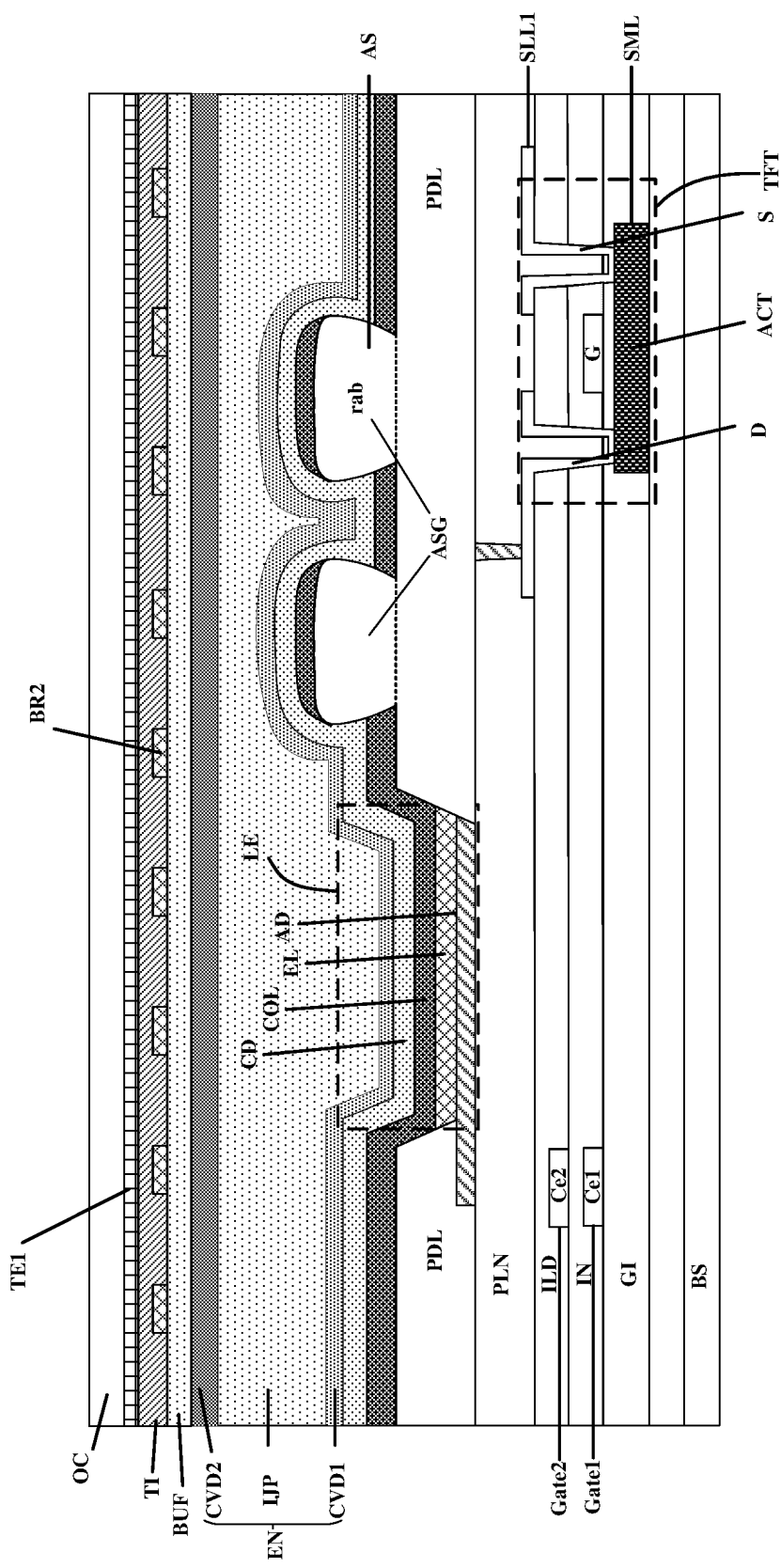
FIG. 5B is a cross-sectional view of an array substrate in some embodiments according to the present disclosure.

FIG. 5B is a cross-sectional view of an array substrate in some embodiments according to the present disclosure. Referring to FIG. 5B, in some embodiments, the auxiliary structure AS is part of the pixel definition layer PDL.

Figure 5C:
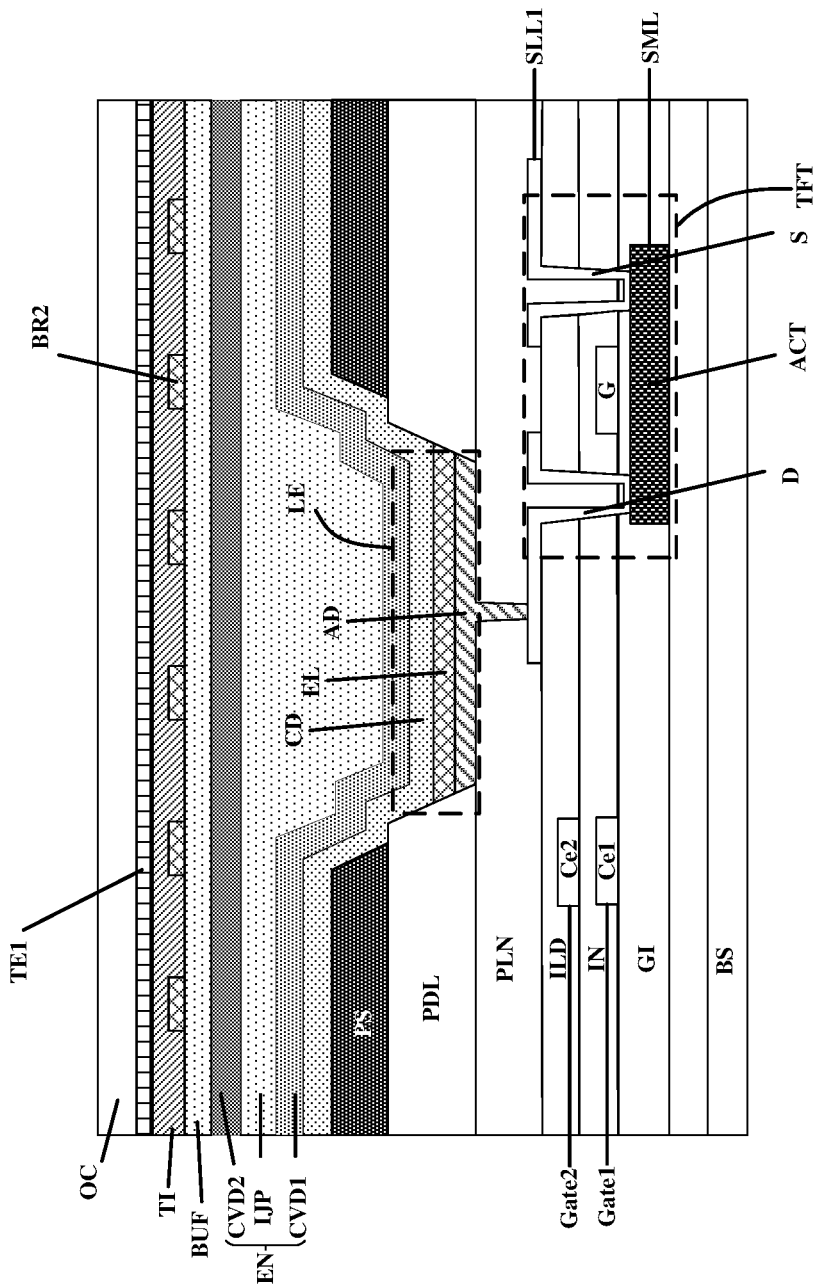
FIG. 5C is a cross-sectional view of an array substrate in some embodiments according to the present disclosure.

FIG. 5C is a cross-sectional view of an array substrate in some embodiments according to the present disclosure. Referring to FIG. 5C, in a region of the array substrate absent of the auxiliary structure AS, the array substrate in some embodiments further includes a plurality of spacers PS on side of the pixel definition layer PDL away from the base substrate BS. Optionally, an orthographic projection of the plurality of groups of auxiliary blocks on the base substrate BS is non-overlapping with an orthographic projection of the plurality of spacers PS on the base substrate BS.

In some embodiments, the array substrate is absent of the plurality of spacers PS.

Figure 6:
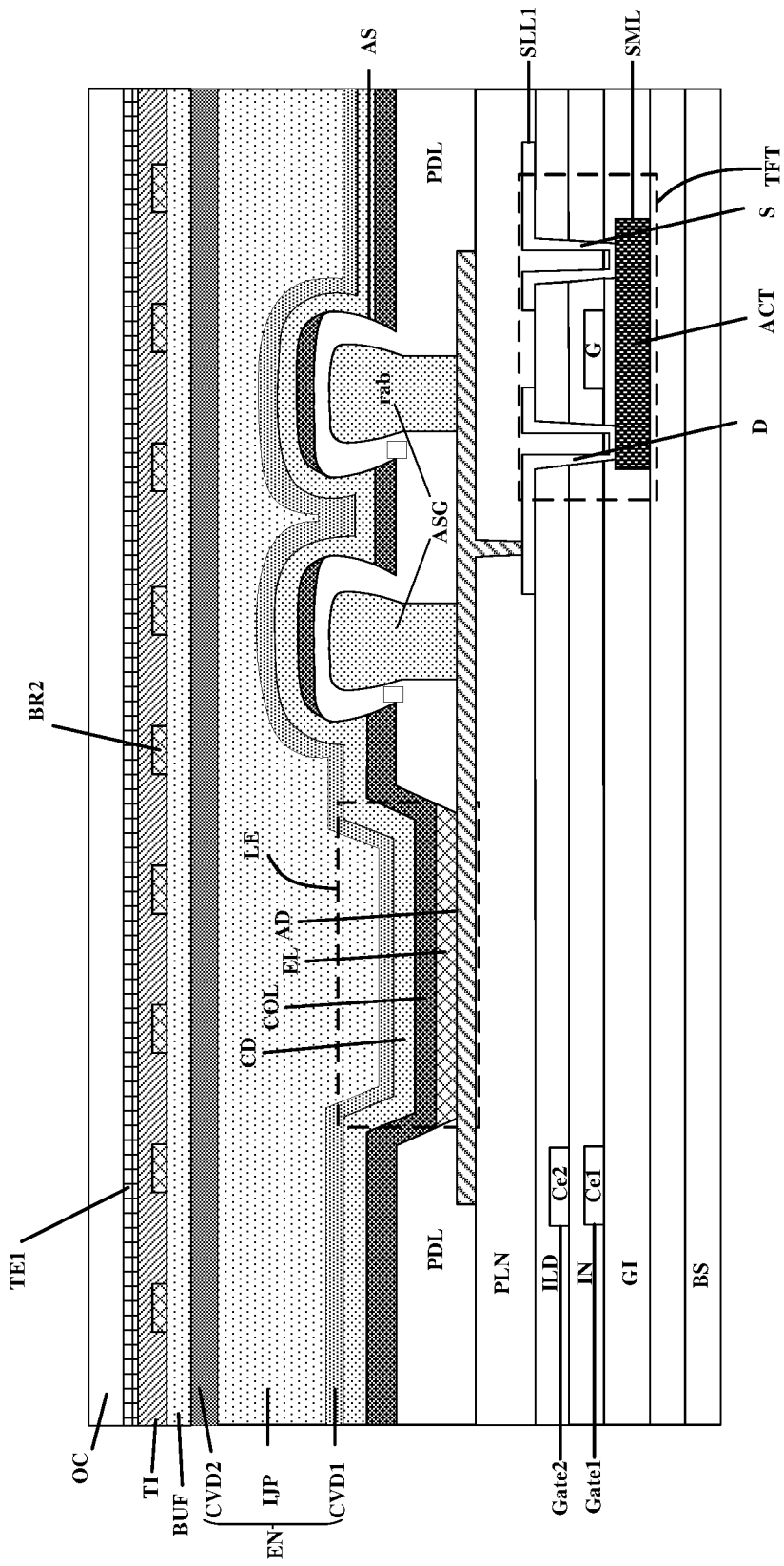
FIG. 6 is a cross-sectional view of an array substrate in some embodiments according to the present disclosure.

FIG. 6 is a cross-sectional view of an array substrate in some embodiments according to the present disclosure. Referring to FIG. 6, in some embodiments, the auxiliary structure AS is on a side of the pixel definition layer PDL closer to the base substrate BS.

Figure 7:
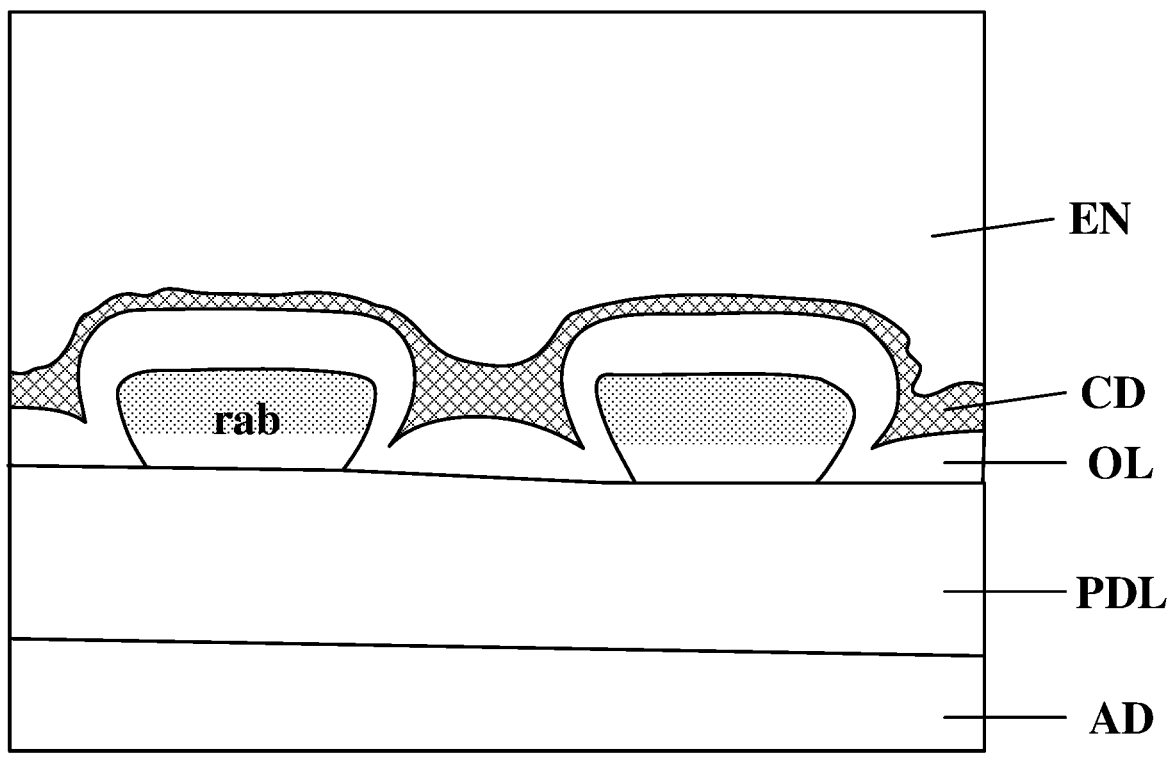
FIG. 7 is a cross-sectional view of a zoom-in region in an array substrate in some embodiments according to the present disclosure.

FIG. 7 is a cross-sectional view of a zoom-in region in an array substrate in some embodiments according to the present disclosure. Referring to FIG. 7, the array substrate includes a pixel definition layer PDL on an anode AD, a respective auxiliary block rab on a side of the pixel definition layer PDL away from the anode AD, one or more organic layers OL on a side of the respective auxiliary block rab away from the pixel definition layer PDL, a cathode layer CD on a side of the one or more organic layers OL away from the respective auxiliary block rab, and an encapsulating layer EN on a side of the cathode layer CD away from the one or more organic layers OL.

Figure 8:
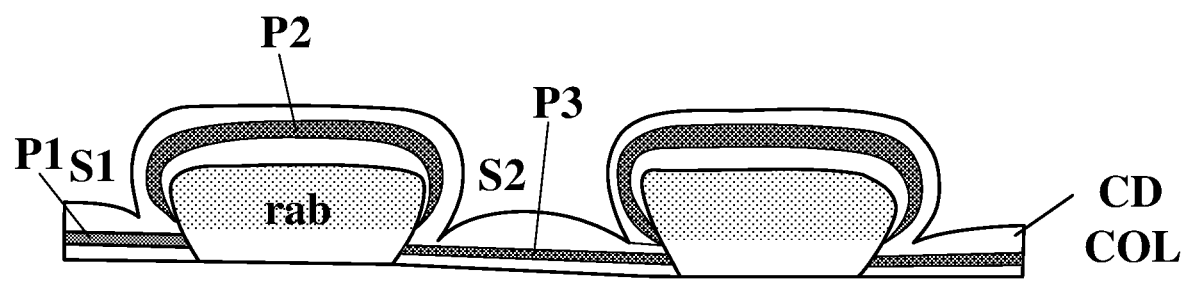
FIG. 8 is a cross-sectional view of a respective group of a plurality of groups of auxiliary blocks in some embodiments according to the present disclosure.

FIG. 8 is a cross-sectional view of a respective group of a plurality of groups of auxiliary blocks in some embodiments according to the present disclosure. Referring to FIG. 7 and FIG. 8, the one or more organic layer OL in some embodiments includes a light emitting layer EL, a common organic layer COL on a side of the light emitting layer away from the pixel definition layer and the respective auxiliary block rab, and a cathode layer CD on a side of the common organic layer COL away from the light emitting layer EL. In some embodiments, the common organic layer COL has a first part P1 on a first side S1 of the respective auxiliary block rab, a second part P2 on a side of the respective auxiliary block rab away from the pixel definition layer PDL, and a third part P3 on a second side S2 of the respective auxiliary block rab. The second part P2 is at least partially segregated from the first part P1 and the third part P3 due to the presence of the respective auxiliary block rab. The inventors of the present discover that cross-talk between adjacent subpixels can be eliminated, particularly when the common organic layer COL includes a relatively conductive material, because the common organic layer COL is discontinued in the inter-subpixel region.

Figure 9:
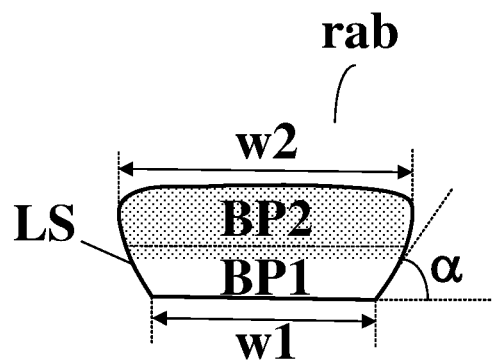
FIG. 9 illustrates a structure of a respective auxiliary block in some embodiments according to the present disclosure.

FIG. 9 illustrates a structure of a respective auxiliary block in some embodiments according to the present disclosure. Referring to FIG. 8, FIG. 9, and FIG. 3, a width of the respective auxiliary block rab, along a direction crossing over the respective auxiliary block rab, gradually decreases from a side away from the base substrate BS to a side closer to the base substrate BS. In some embodiments, the respective auxiliary block rab includes a first block portion BP1 closer to the base substrate BS and a second block portion BP2 away from the base substrate BS; a maximum width w1 of the first portion P1, along the direction crossing over the respective auxiliary block rab, is smaller than a maximum width w2 of the second portion P2, along the direction crossing over the respective auxiliary block rab.

In some embodiments, a lateral side LS of the respective auxiliary block rab has a slope angle α with respect to a layer in contact with the respective auxiliary block rab (e.g., the pixel definition layer PDL). Optionally, the slope angle α is in a range of 60 degrees to 80 degrees, e.g., 60 degrees to 65 degrees, 65 degrees to 70 degrees, 70 degrees to 75 degrees, or 75 degrees to 80 degrees. It is understood that the upper and lower limits are approximate and are not limited to an expressly recited value. In one example, the slope angle α is 70 degrees. The inventors of the present disclosure discover that, by having the slope angle in this range, it can be ensured that the subsequent layers (e.g., the encapsulating layer) can be properly formed, while at the same time, the common organic layer COL can be sufficiently segregated. It is understood that the upper and lower limits are approximate and are not limited to an expressly recited value.

FIG. 9 shows a cross-sectional view in a cross-section intersecting a lateral direction of the respective auxiliary block rab. Depending on the orientation of the cross-section, the cross-sections of the respective auxiliary block rab may have other shapes. For example, along a B-B' line in FIG. 2, the cross-section intersecting a longitudinal direction of the respective auxiliary block rab has a substantially rectangular shape. In another example, along a C-C' line in FIG. 2, the cross-section comprises two separate sub-sections, each sub-section has an inverted trapezoidal shape. The terminal side of the respective auxiliary block rab (e.g., the sides of the respective auxiliary block rab adjacent to B or B' in FIG. 2) has a slope angle with respect to a layer in contact with the respective auxiliary block rab in a range of 80 degrees to 100 degrees. It is understood that the upper and lower limits are approximate and are not limited to an expressly recited value.

Figure 10:
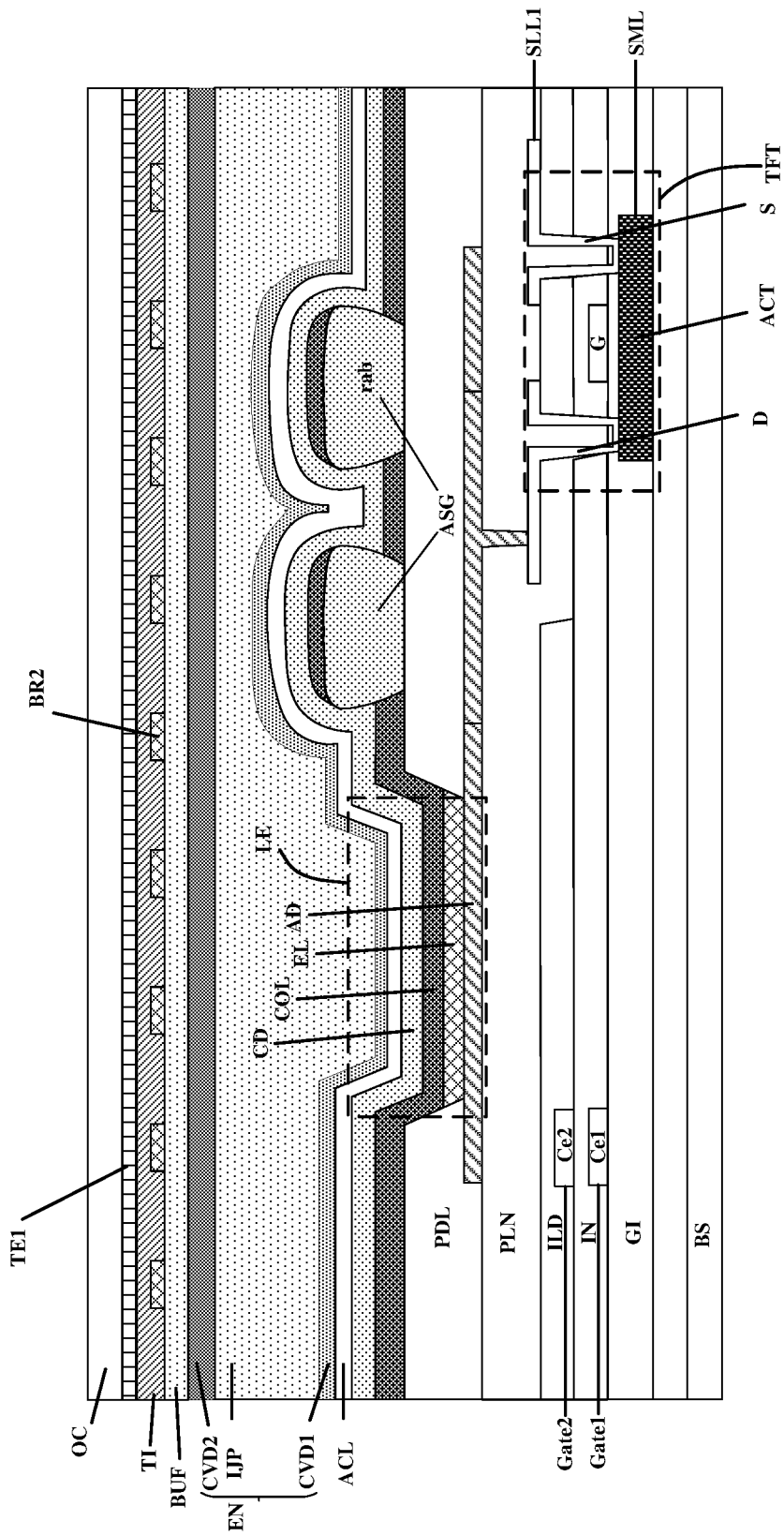
FIG. 10 is a cross-sectional view of an array substrate in some embodiments according to the present disclosure.

FIG. 10 is a cross-sectional view of an array substrate in some embodiments according to the present disclosure. Referring to FIG. 10, the array substrate in some embodiments further includes an auxiliary conductive layer ACL on a side of the cathode layer CD away from the pixel definition layer PDL. Optionally, the auxiliary conductive layer ACL is a substantially transparent conductive layer, which may function as an auxiliary cathode. Optionally, the cathode layer CD is a unitary layer extending across the plurality of subpixel regions and the inter-subpixel region. Optionally, the auxiliary conductive layer ACL is a unitary layer extending across the plurality of subpixel regions and the inter-subpixel region. The auxiliary conductive layer may be formed using a metal oxide material such as aluminum zinc oxide, indium zinc oxide, and zinc oxide. The auxiliary conductive layer may be formed by various appropriate methods such as sputtering or atomic layer deposition. In some embodiments, adhesion of the auxiliary conductive layer ACL is greater than adhesion of the cathode layer CD, and less than adhesion of a sub-layer (e.g., the first inorganic encapsulating sub-layer) of the encapsulating layer EN in contact with the auxiliary conductive layer ACL.

Figure 11:
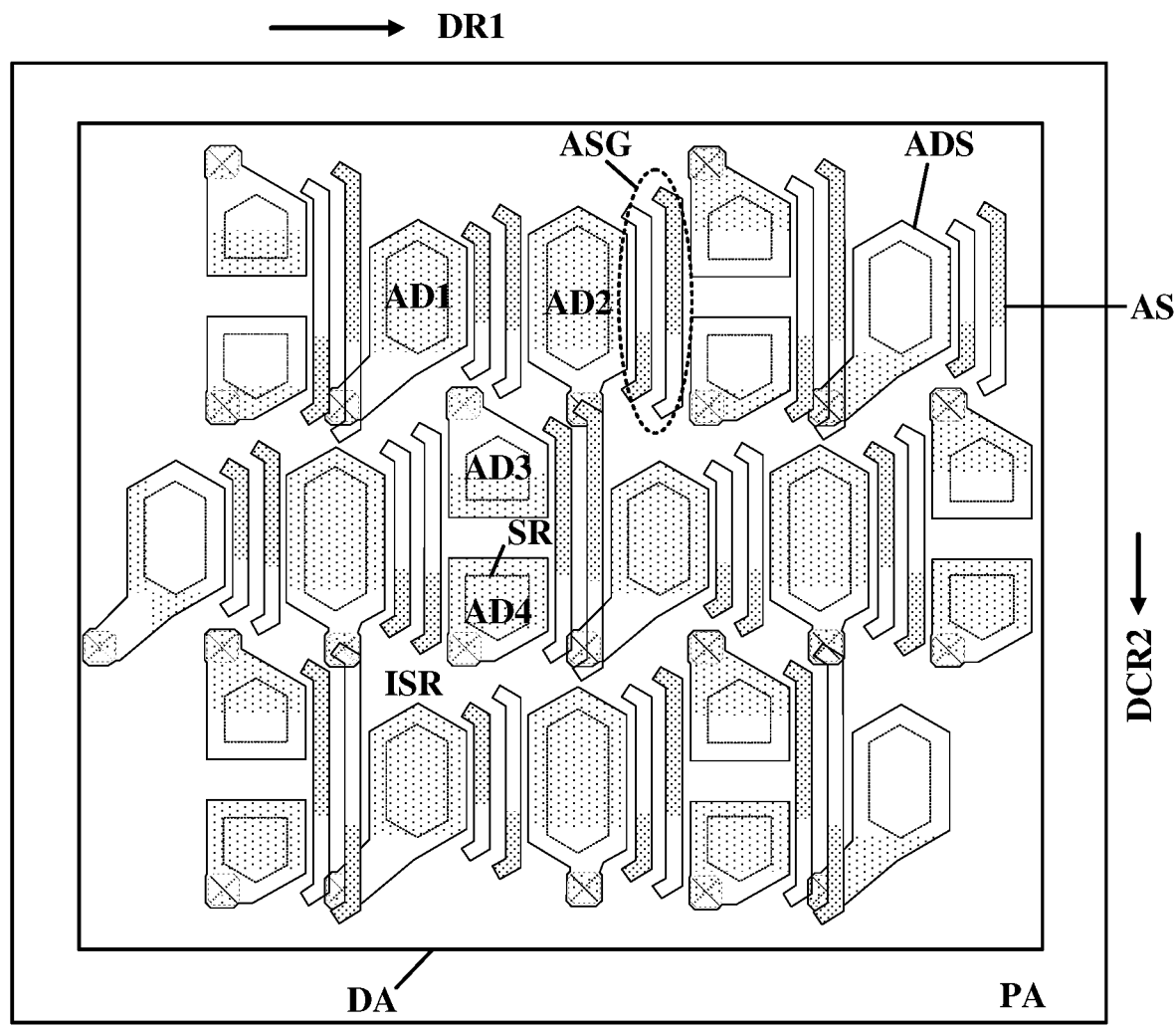
FIG. 11 is a schematic diagram illustrating the structure of an array substrate in some embodiments according to the present disclosure.
Figure 12:
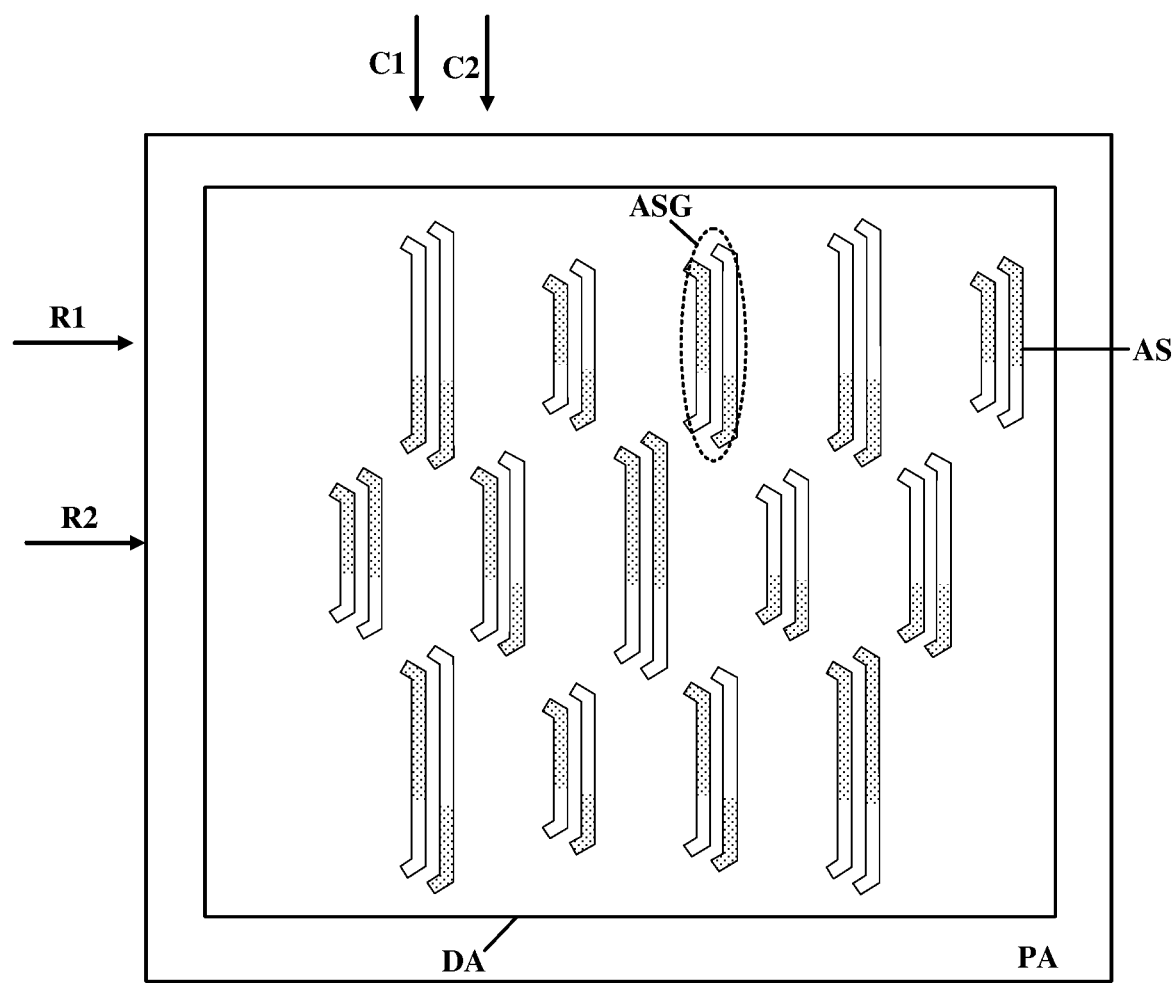
FIG. 12 depicts an arrangement of groups of auxiliary blocks in an array substrate in some embodiments according to the present disclosure.

FIG. 11 is a schematic diagram illustrating the structure of an array substrate in some embodiments according to the present disclosure. FIG. 12 depicts an arrangement of groups of auxiliary blocks in an array substrate in some embodiments according to the present disclosure. Referring to FIG. 11 and FIG. 12, in some embodiments, the one or more auxiliary blocks in the respective group of the plurality of groups of auxiliary blocks ASG have a conforming shape, for example, extension directions of the one or more auxiliary blocks in a same group are substantially parallel to each other, overall shapes of the one or more auxiliary blocks in the same group are substantially the same. The one or more auxiliary blocks in the same group may have different sizes, for example, the one or more auxiliary blocks in the same group may occupy different areas or have different thicknesses or widths.

Referring to FIG. 11 and FIG. 12, in some embodiments, the plurality of groups of auxiliary blocks ASG are arranged in a pattern, for example, a repeating pattern. In one example, groups of auxiliary blocks in adjacent rows (e.g., R1 and R2) are staggered. In another example, groups of auxiliary blocks in adjacent columns (e.g., C1 and C2) are staggered. In another example, shapes of auxiliary blocks in the auxiliary structure AS are curved toward a same direction, as shown in FIG. 12.

In some embodiments, auxiliary blocks of the auxiliary structure have a longitudinal shape. Longitudinal directions of the auxiliary blocks are substantially parallel to one of a first direction DR1 and a second direction DR2, but not to the other one of the first direction DR1 and the second direction DR2, the first direction DR1 and the second direction DR2 being different directions. Referring to FIG. 11, the longitudinal directions of the auxiliary blocks are substantially parallel to the second direction DR2, but not to the first direction DR1.

In one example depicted in FIG. 11, at least the anode of the first type AD1 and the anode of the second type AD2 have an elongated shape. The plurality of groups of auxiliary blocks ASG are present between longitudinal sides of the anode of the first type AD1 and the anode of the second type AD2 adjacent to each other. Optionally, the longitudinal sides of the anode of the first type AD1 and the anode of the second type AD2 adjacent to each other are substantially parallel to each other. Extension directions of the auxiliary blocks are substantially parallel to the longitudinal sides of the anode of the first type AD1 and the anode of the second type AD2.

In some embodiments, at least a first subpixel region corresponding to the anode of the first type AD1 and a second subpixel region corresponding to the anode of the second type AD2 have an elongated shape. The plurality of groups of auxiliary blocks are present between longitudinal sides of the first subpixel region and the second subpixel region adjacent to each other. Optionally, extension directions of auxiliary blocks of the auxiliary structure are substantially parallel to the longitudinal sides of the first subpixel region and the second subpixel region.

Figure 13:
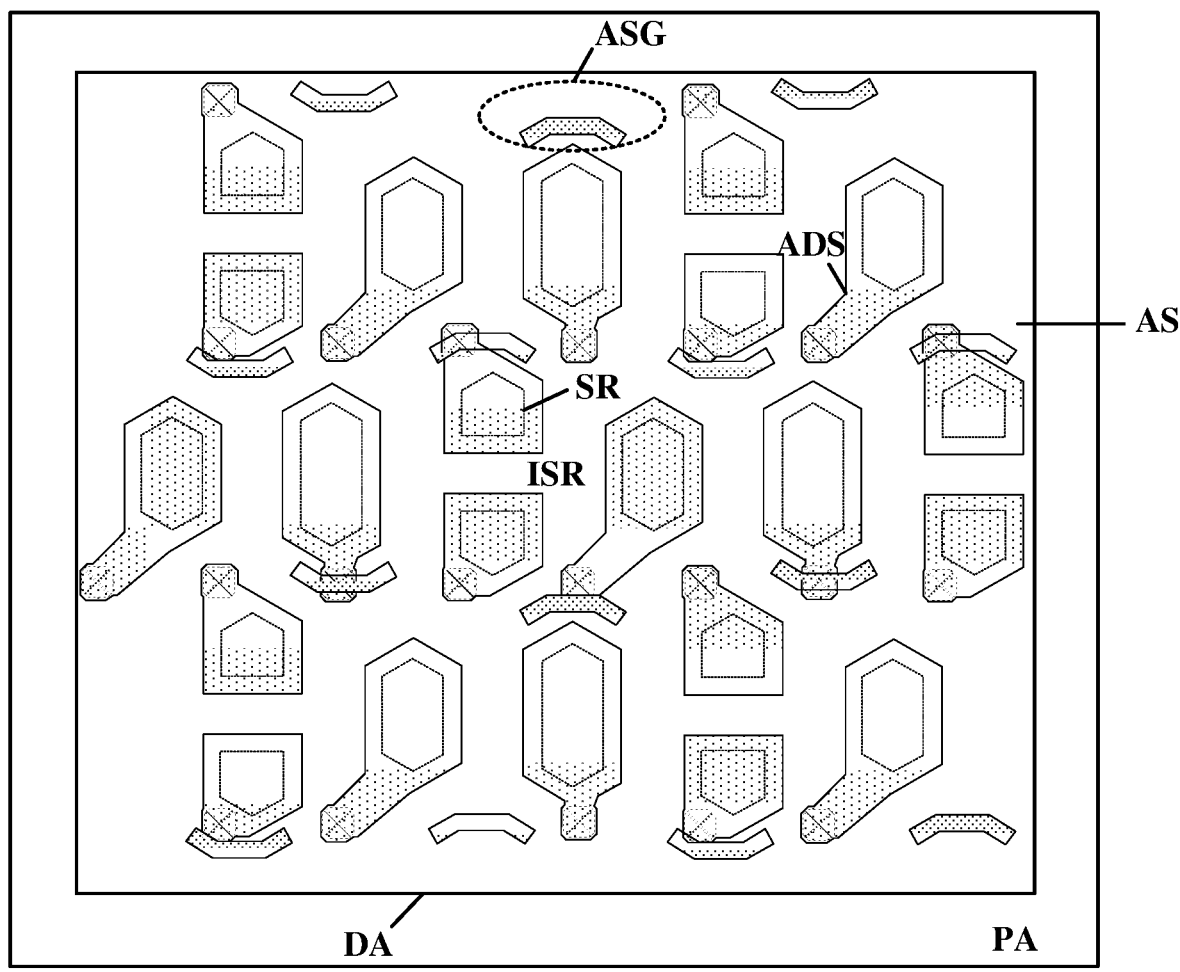
FIG. 13 is a schematic diagram illustrating the structure of an array substrate in some embodiments according to the present disclosure.
Figure 14:
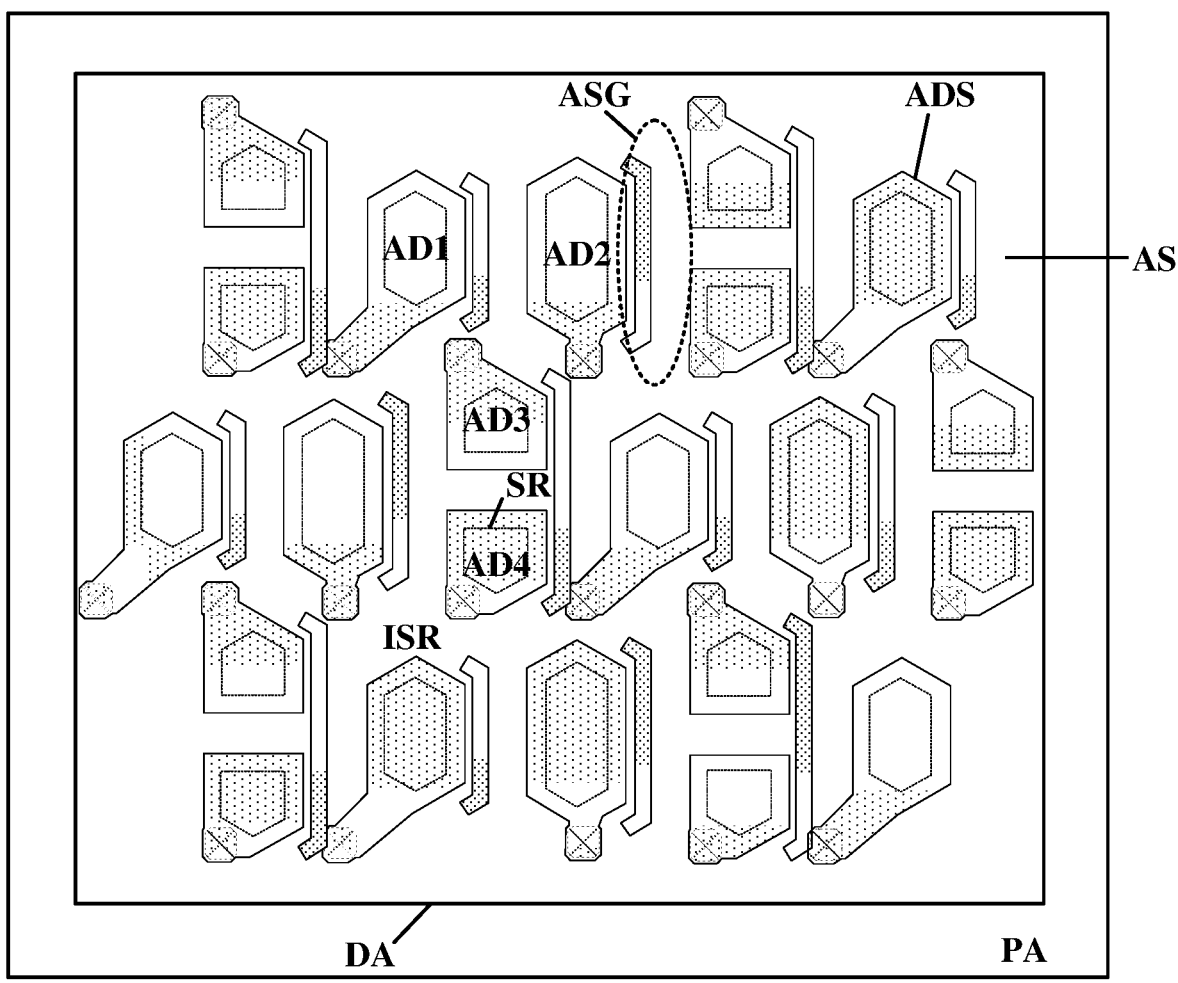
FIG. 14 is a schematic diagram illustrating the structure of an array substrate in some embodiments according to the present disclosure.

FIG. 13 is a schematic diagram illustrating the structure of an array substrate in some embodiments according to the present disclosure. FIG. 14 is a schematic diagram illustrating the structure of an array substrate in some embodiments according to the present disclosure. Referring to FIG. 13 and FIG. 14, in some embodiments, a respective group of the plurality of groups of auxiliary blocks ASG includes a single auxiliary block.

Figure 15:
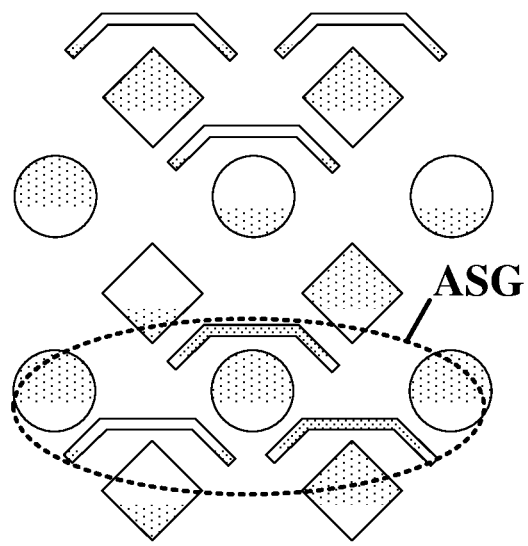
FIG. 15 is a schematic diagram illustrating the structure of an array substrate in some embodiments according to the present disclosure.

FIG. 15 is a schematic diagram illustrating the structure of an array substrate in some embodiments according to the present disclosure. Referring to FIG. 15, in some embodiments, a respective group of the plurality of groups of auxiliary blocks ASG includes three auxiliary blocks.

Figure 16:
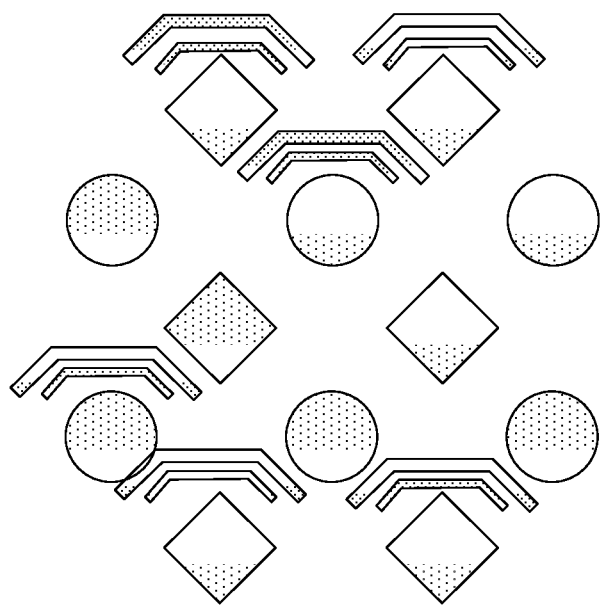
FIG. 16 is a schematic diagram illustrating the structure of an array substrate in some embodiments according to the present disclosure.

FIG. 16 is a schematic diagram illustrating the structure of an array substrate in some embodiments according to the present disclosure. Referring to FIG. 16, in some embodiments, the plurality of groups of auxiliary blocks ASG lack a repeating pattern.

Figure 17:
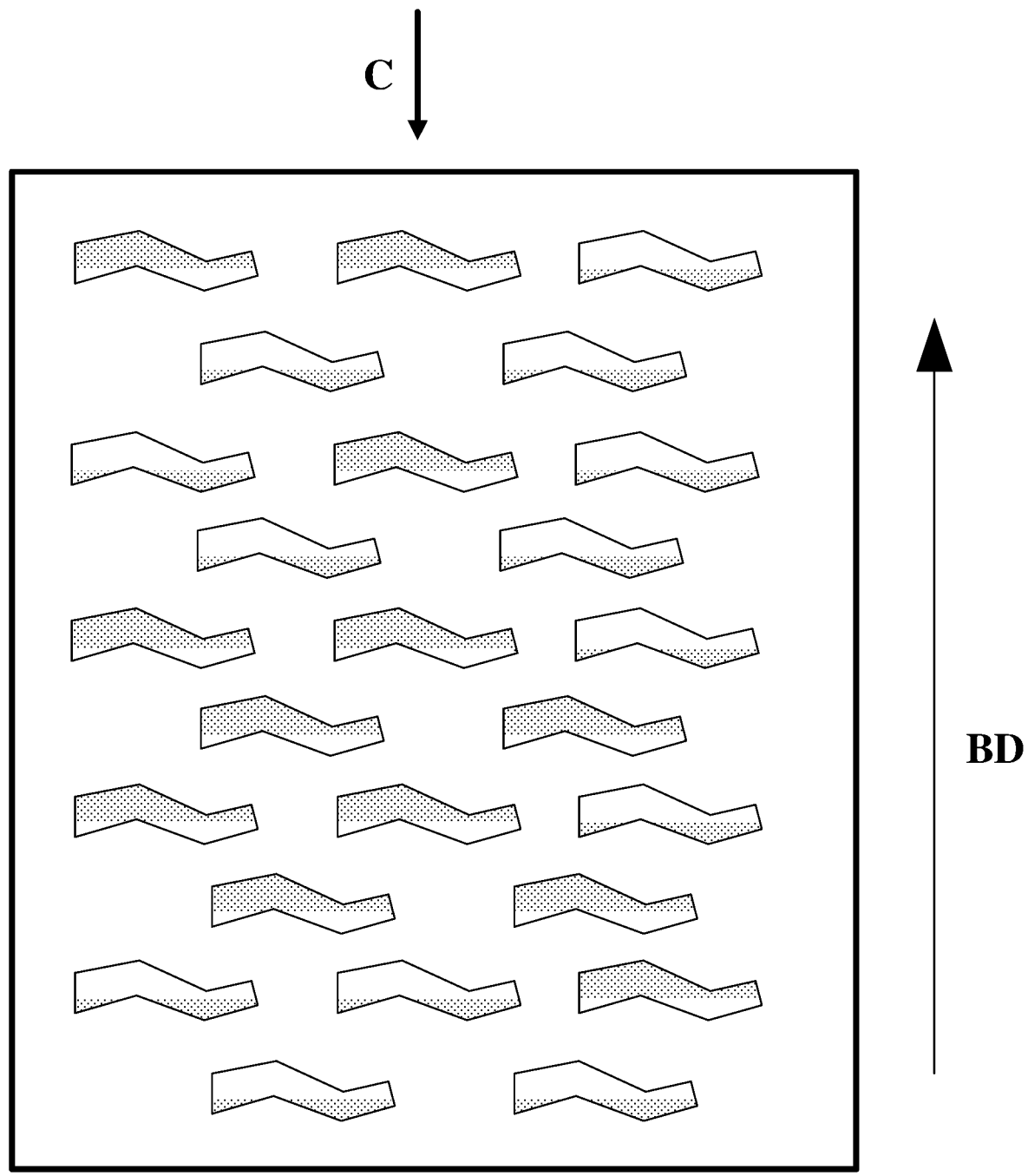
FIG. 17 depicts an arrangement of groups of auxiliary blocks in an array substrate in some embodiments according to the present disclosure.

FIG. 17 depicts an arrangement of groups of auxiliary blocks in an array substrate in some embodiments according to the present disclosure. Referring to FIG. 17, in some embodiments, the array substrate is a bendable array substrate configured to be bent along a bending direction BD. The auxiliary blocks are arranged in a plurality of columns C. Auxiliary blocks in a respective column of the plurality of columns C are arranged in a direction substantially parallel to the bending direction BD. Optionally, an extension direction of each auxiliary block is substantially perpendicular to the bending direction BD.

Figure 18:
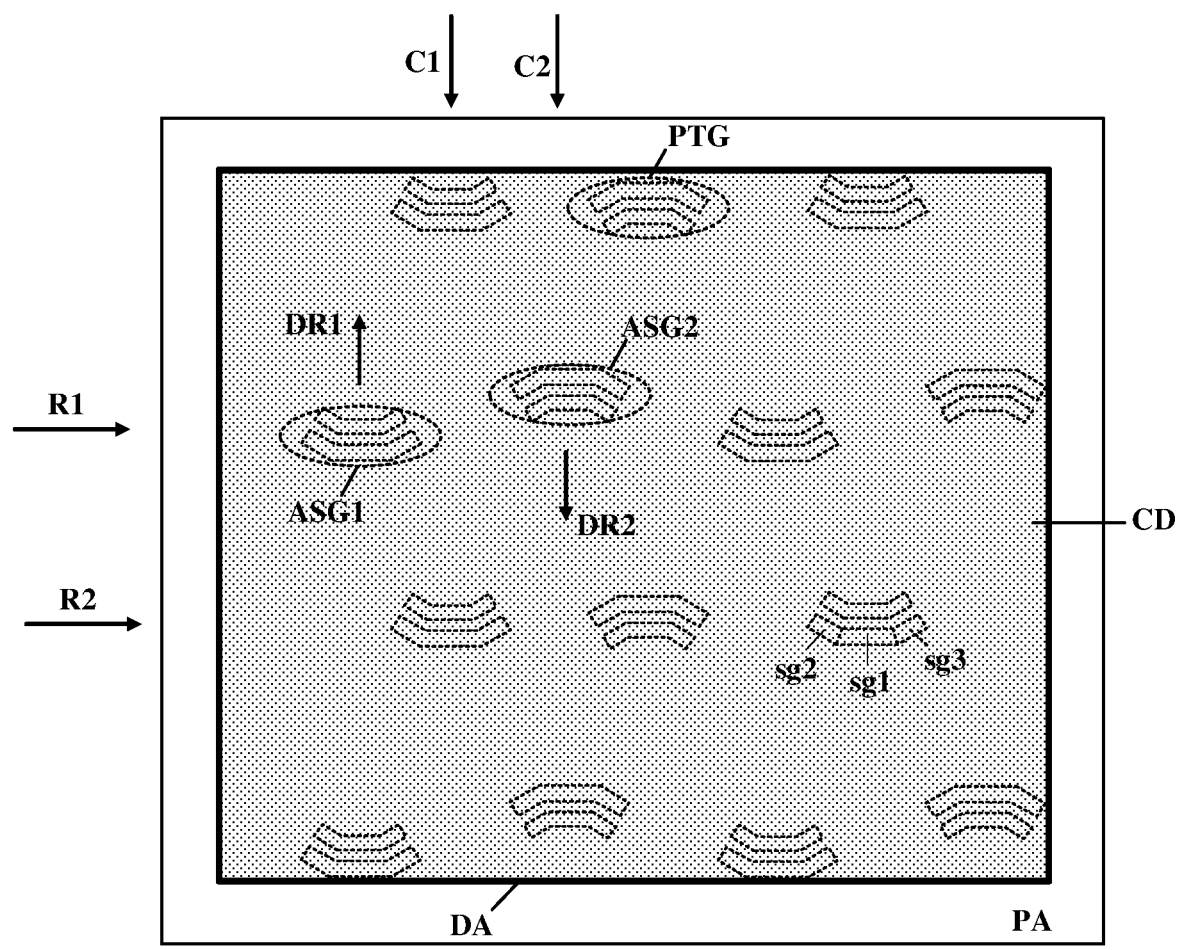
FIG. 18 is a diagram illustrating the structure of a cathode layer in some embodiments according to the present disclosure.
Figure 19:
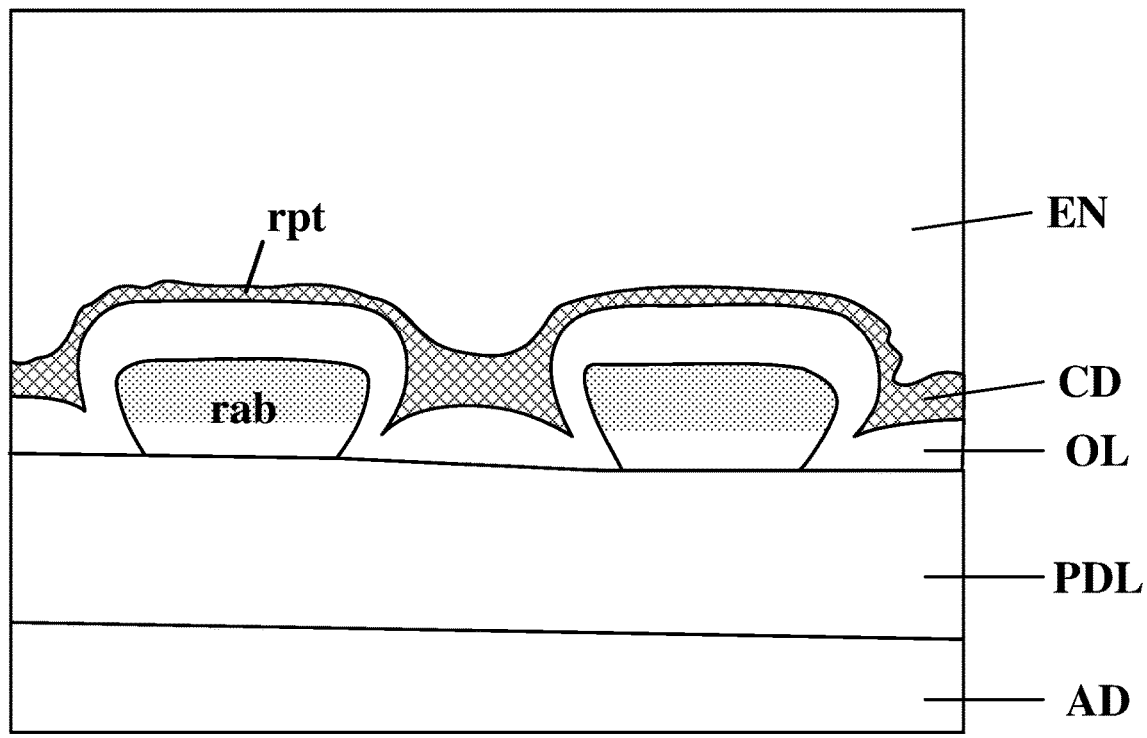
FIG. 19 is a cross-sectional view of a zoom-in region in an array substrate in some embodiments according to the present disclosure.

FIG. 18 is a diagram illustrating the structure of a cathode layer in some embodiments according to the present disclosure. FIG. 19 is a cross-sectional view of a zoom-in region in an array substrate in some embodiments according to the present disclosure. Referring to FIG. 18 and FIG. 19, the cathode layer CD is a unitary structure extending across the plurality of subpixel regions and the inter-subpixel region. The unitary structure of the cathode layer CD in some embodiments includes a plurality of groups of protrusions PTG in the inter-subpixel region ISR. A respective group of the plurality of groups of protrusions PTG is between two or more subpixel regions.

In some embodiments, referring to FIG. 4, FIG. 18, FIG. 3, FIG. 5A, FIG. 5B, FIG. 6, and FIG. 10, the respective group of the plurality of groups of protrusions PTG is on a side of the respective group of the plurality of groups of auxiliary blocks ASG away from the base substrate BS. Optionally, an orthographic projection of the respective group of the plurality of groups of protrusions PTG on the base substrate BS at least partially overlaps with an orthographic projection of the respective group of the plurality of groups of auxiliary blocks ASG on the base substrate BS. Optionally, the orthographic projection of the respective group of the plurality of groups of protrusions PTG on the base substrate BS covers an orthographic projection of the respective group of the plurality of groups of auxiliary blocks ASG on the base substrate BS.

In some embodiments, the respective group of the plurality of groups of protrusions PTG includes one or more protrusions. In one example, the one or more protrusions in the respective group of the plurality of groups of protrusions PTG have a conforming shape, for example, extension directions of the one or more protrusions in a same group are substantially parallel to each other, overall shapes of the one or more protrusions in the same group are substantially the same. The one or more protrusions in the same group may have different sizes, for example, the one or more protrusions in the same group may occupy different areas or have different thicknesses or widths.

Referring to FIG. 19, the array substrate includes a pixel definition layer PDL on an anode AD, a respective auxiliary block rab on a side of the pixel definition layer PDL away from the anode AD, one or more organic layers OL on a side of the respective auxiliary block rab away from the pixel definition layer PDL, a respective protrusion rpt on a side of the one or more organic layers OL away from the respective auxiliary block rab, and an encapsulating layer EN on a side of the cathode layer CD away from the one or more organic layers OL.

Referring to FIG. 19 and FIG. 8, in some embodiments, the common organic layer COL has a first part P1 on a first side S1 of the respective auxiliary block rab, a second part P2 on a side of the respective auxiliary block rab away from the pixel definition layer PDL, and a third part P3 on a second side S2 of the respective auxiliary block rab. The respective protrusion rpt is on a side of the third part P3 away from the respective auxiliary block rab.

The inventors of the present disclosure discover that a synergistic effect can be achieved by combining the auxiliary block according to the present disclosure and one or more transition sub-layers in the encapsulating layer, in terms of reducing or eliminating inter-layer peeling defects. In some embodiments, the transition sub-layer is disposed between two adjacent layers, adhesion of the transition sub-layer is greater than adhesion of one of the two adjacent layers, and less than adhesion of another one of the two adjacent layers.

Figure 20:
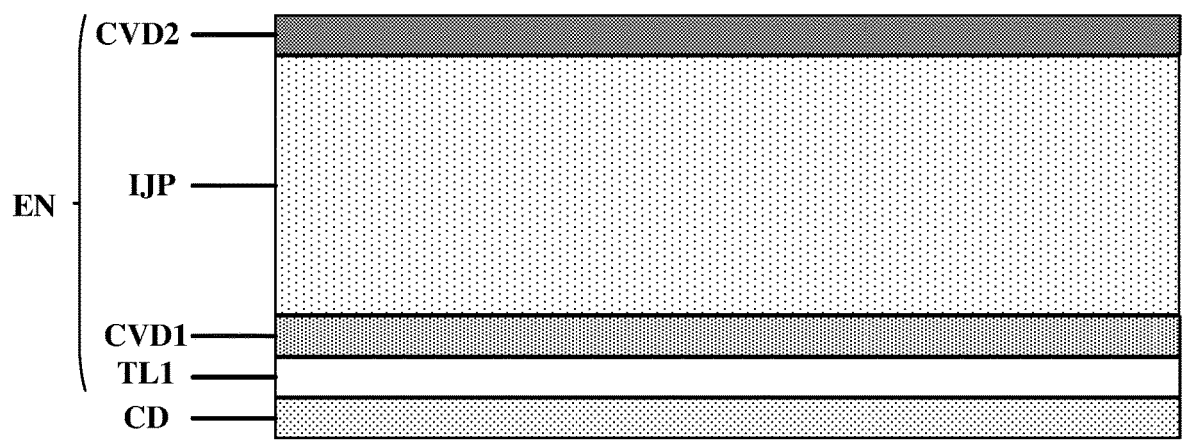
FIG. 20 is a schematic diagram illustrating the structure of an encapsulating layer in some embodiments according to the present disclosure.

FIG. 20 is a schematic diagram illustrating the structure of an encapsulating layer in some embodiments according to the present disclosure. Referring to FIG. 20, the encapsulating layer EN in some embodiments includes a first transition sub-layer TL1 on a cathode layer CD, a first inorganic encapsulating sub-layer CVD1 on a side of the first transition sub-layer TL1 away from the cathode layer CD, an organic encapsulating sub-layer IJP on a side of the first inorganic encapsulating sub-layer CVD1 away from the first transition sub-layer TL1, and a second inorganic encapsulating sub-layer CVD2 on a side of the organic encapsulating sub-layer IJP away from the first inorganic encapsulating sub-layer CVD1. Various appropriate materials may be used for making the first transition sub-layer TL1. Examples of materials for making the first transition sub-layer TL1 include silicon oxide ($S_iON_x$), silicon carbonitride (SEN), or silicon nitride ($S_iN_x$). Various appropriate materials may be used for making the first inorganic encapsulating sub-layer CVD1. Examples of materials for making the first inorganic encapsulating sub-layer CVD1 include silicon nitride ($S_iN_x$), silicon oxynitride ($S_iON_x$), or aluminum oxide (AlO). Various appropriate materials may be used for making the organic encapsulating sub-layer IJP. Examples of materials for making the organic encapsulating sub-layer IJP include silicon nitride ($S_iN_x$), silicon oxynitride ($S_iON_x$), or aluminum oxide (AlO). Various appropriate materials may be used for making the second inorganic encapsulating sub-layer CVD2. Examples of materials for making the second inorganic encapsulating sub-layer CVD2 include silicon carbonitride, silicon nitride ($S_iN_x$), silicon oxynitride ($S_iON_x$), or aluminum oxide (AlO). Adhesion of the first transition sub-layer TL1 is greater than adhesion of the cathode layer CD, and less than adhesion of the first inorganic encapsulating sub-layer CVD1.

Figure 21:
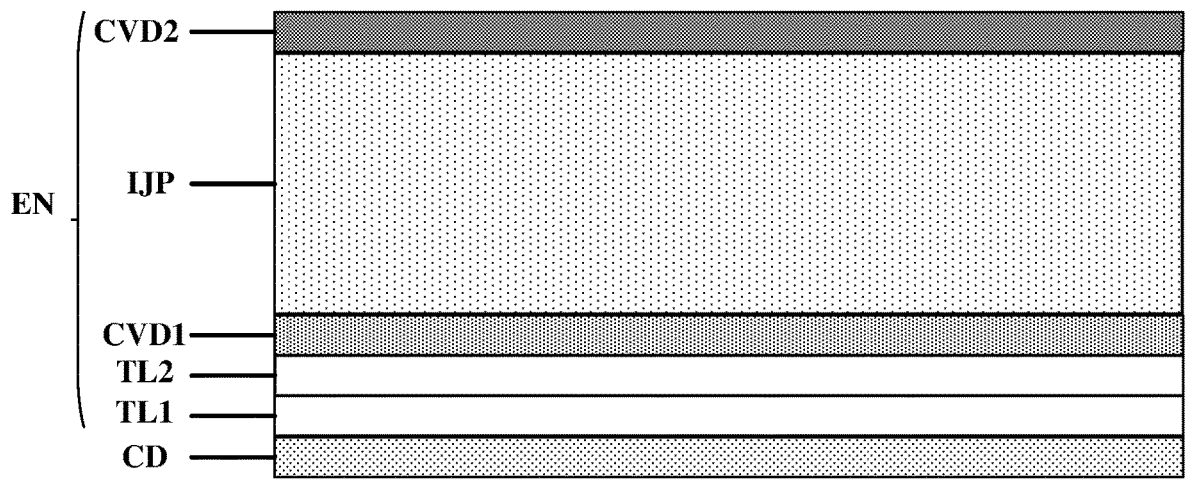
FIG. 21 is a schematic diagram illustrating the structure of an encapsulating layer in some embodiments according to the present disclosure.

FIG. 21 is a schematic diagram illustrating the structure of an encapsulating layer in some embodiments according to the present disclosure. Referring to FIG. 21, the encapsulating layer EN in some embodiments includes a first transition sub-layer TL1 on a cathode layer CD, a second transition sub-layer TL2 on a side of the first transition sub-layer TL1 away from the cathode layer CD, a first inorganic encapsulating sub-layer CVD1 on a side of the second transition sub-layer TL2 away from the first transition sub-layer TL1, an organic encapsulating sub-layer IJP on a side of the first inorganic encapsulating sub-layer CVD1 away from the second transition sub-layer TL2, and a second inorganic encapsulating sub-layer CVD2 on a side of the organic encapsulating sub-layer IJP away from the first inorganic encapsulating sub-layer CVD1.

Various appropriate materials may be used for making the first transition sub-layer TL1. Examples of materials for making the first transition sub-layer TL1 include silicon carbonitride, the adhesion force of silicon carbonitride is about 0.6N to 0.7N. Various appropriate materials may be used for making the second transition sub-layer TL2. Examples of materials for making the second transition sub-layer TL2 include silicon nitride, the adhesion of silicon nitride is about 1.3N to 1.9N. Various appropriate materials may be used for making the first inorganic encapsulating sub-layer CVD1. Examples of materials for making the first inorganic encapsulating sub-layer CVD1 include silicon oxynitride, and the adhesion of silicon oxynitride is about 2.5N to 2.8N.

Adhesion of the first transition sub-layer TL1 is greater than adhesion of the cathode layer CD, and less than adhesion of the second transition sub-layer TL2. Adhesion of the second transition sub-layer TL2 is greater than adhesion of the first transition sub-layer TL1, and less than adhesion of the first inorganic encapsulating sub-layer CVD1.

Figure 22:
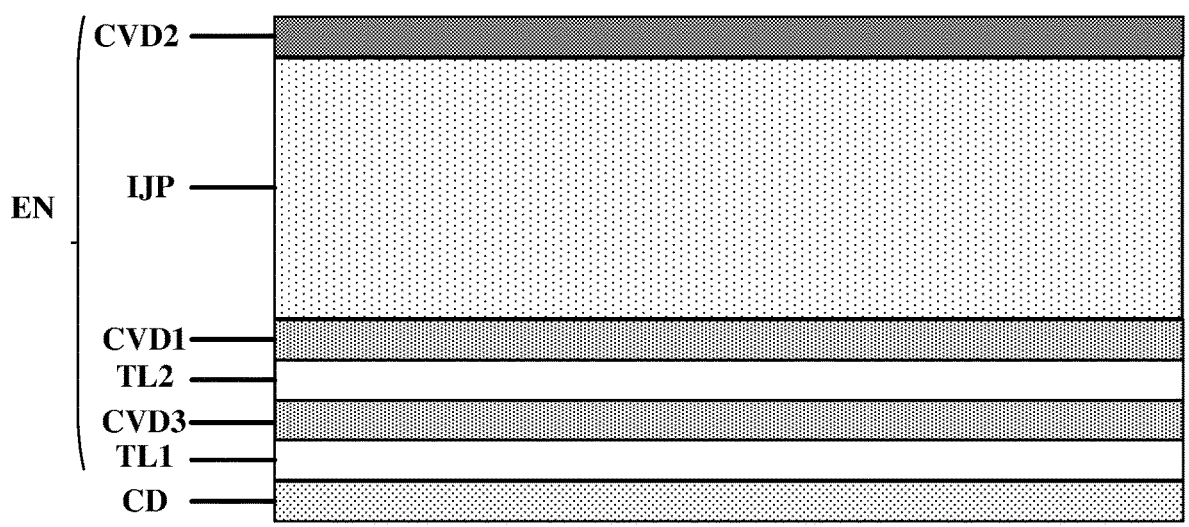
FIG. 22 is a schematic diagram illustrating the structure of an encapsulating layer in some embodiments according to the present disclosure.

FIG. 22 is a schematic diagram illustrating the structure of an encapsulating layer in some embodiments according to the present disclosure. Referring to FIG. 22, the encapsulating layer EN in some embodiments includes a first transition sub-layer TL1 on a cathode layer CD, a third inorganic encapsulating sub-layer CVD3 on a side of the first transition sub-layer TL1 away from the cathode layer CD, a second transition sub-layer TL2 on a side of the third inorganic encapsulating sub-layer CVD3 away from the first transition sub-layer TL1, a first inorganic encapsulating sub-layer CVD1 on a side of the second transition sub-layer TL2 away from the third inorganic encapsulating sub-layer CVD3, an organic encapsulating sub-layer IJP on a side of the first inorganic encapsulating sub-layer CVD1 away from the second transition sub-layer TL2, and a second inorganic encapsulating sub-layer CVD2 on a side of the organic encapsulating sub-layer IJP away from the first inorganic encapsulating sub-layer CVD1.

Adhesion of the first transition sub-layer TL1 is greater than adhesion of the cathode layer CD, and less than adhesion of the third inorganic encapsulating sub-layer CVD3. Adhesion of the third inorganic encapsulating sub-layer CVD3 is greater than adhesion of the first transition sub-layer TL1, and less than adhesion of the second transition sub-layer TL2. Adhesion of the second transition sub-layer TL2 is greater than adhesion of the third inorganic encapsulating sub-layer CVD3, and less than adhesion of the first inorganic encapsulating sub-layer CVD1.

Various appropriate materials may be used for making the first transition sub-layer TL1. Examples of materials for making the first transition sub-layer TL1 include silicon oxide, the adhesion of silicon oxide is about 0.2N to 0.4N. Various appropriate materials may be used for making the second transition sub-layer TL2. Examples of materials for making the second transition sub-layer TL2 include silicon nitride, the adhesion force of silicon nitride is about 1.3N to 1.9N. Various appropriate materials may be used for making the third inorganic encapsulating sub-layer CVD3. Examples of materials for making the third inorganic encapsulating sub-layer CVD3 include carbon nitrogen, the adhesion force of silicon carbide and silicon carbonitride is about 0.6N to 0.7N. Various appropriate materials may be used for making the first inorganic encapsulating sub-layer CVD1. Examples of materials for making the first inorganic encapsulating sub-layer CVD1 include silicon oxynitride, and the adhesion of silicon oxynitride is about 2.5N to 2.8N.

Figure 23:
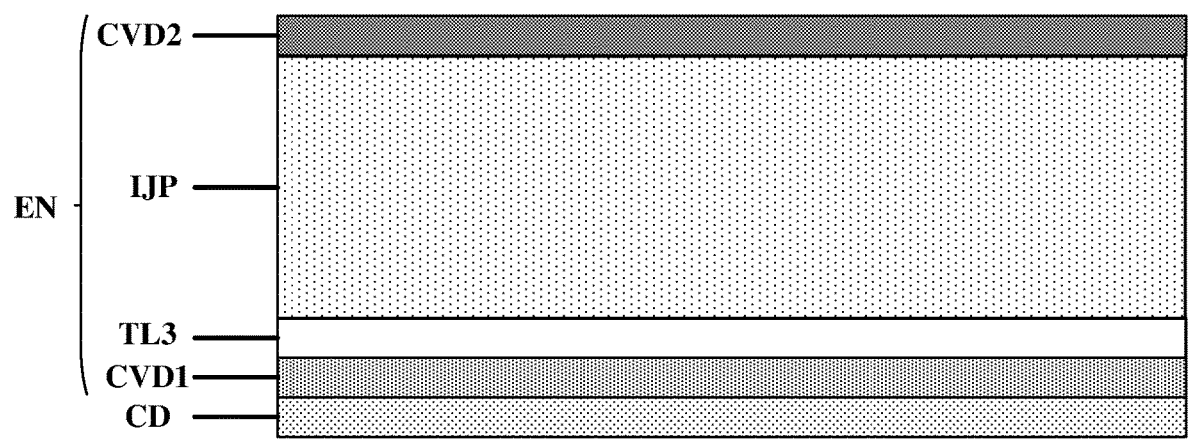
FIG. 23 is a schematic diagram illustrating the structure of an encapsulating layer in some embodiments according to the present disclosure.

FIG. 23 is a schematic diagram illustrating the structure of an encapsulating layer in some embodiments according to the present disclosure. Referring to FIG. 23, the encapsulating layer EN in some embodiments includes a first inorganic encapsulating sub-layer CVD1 on a cathode layer CD, a third transition sub-layer TL3 on a side of the first inorganic encapsulating sub-layer CVD1 away from the cathode layer CD, an organic encapsulating sub-layer IJP on a side of the third transition sub-layer TL3 away from the first inorganic encapsulating sub-layer CVD1, and a second inorganic encapsulating sub-layer CVD2 on a side of the organic encapsulating sub-layer IJP away from the third transition sub-layer TL3.

Adhesion of the third transition sub-layer TL3 is greater than adhesion of the first inorganic encapsulating sub-layer CVD1, and less than adhesion of the organic encapsulating sub-layer IJP.

Various appropriate materials may be used for making the organic encapsulating sub-layer IJP. Examples of materials for making the organic encapsulating sub-layer IJP include acrylic and epoxy, the adhesion force of acrylic and epoxy is about 10N or more. Various appropriate materials may be used for making the first inorganic encapsulating sub-layer CVD1. In one example, adhesion of the first inorganic encapsulating sub-layer CVD1 is about 4N to 5N. Various appropriate materials may be used for making the third transition sub-layer TL3. Examples of materials for making the third transition sub-layer TL3 include a material made by adding adhesion additives to silicon nitride or silicon oxynitride or changing deposition process parameters. In one example, adhesion of the third transition sub-layer TL3 is about 6N to 9N.

Figure 24:
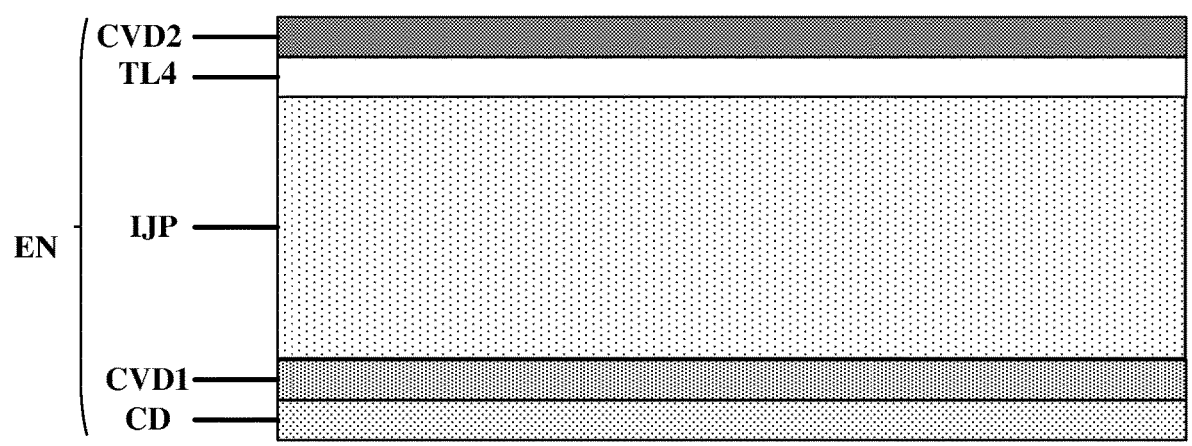
FIG. 24 is a schematic diagram illustrating the structure of an encapsulating layer in some embodiments according to the present disclosure.

FIG. 24 is a schematic diagram illustrating the structure of an encapsulating layer in some embodiments according to the present disclosure. Referring to FIG. 24, the encapsulating layer EN in some embodiments includes a first inorganic encapsulating sub-layer CVD1 on a cathode layer CD, an organic encapsulating sub-layer IJP on a side of the first inorganic encapsulating sub-layer CVD1 away from the cathode layer CD, a fourth transition sub-layer TL4 on a side of the organic encapsulating sub-layer IJP away from the first inorganic encapsulating sub-layer CVD1, and a second inorganic encapsulating sub-layer CVD2 on a side of the fourth transition sub-layer TL4 away from the organic encapsulating sub-layer IJP.

Adhesion of the fourth transition sub-layer TL4 is less than adhesion of the organic encapsulating sub-layer IJP, and greater than adhesion of the second inorganic encapsulating sub-layer CVD2.

Various appropriate materials may be used for making the organic encapsulating sub-layer IJP. Examples of materials for making the organic encapsulating sub-layer IJP include acrylic and epoxy, the adhesion force of acrylic and epoxy is about 10N or more. Various appropriate materials may be used for making the second inorganic encapsulating sub-layer CVD2. Examples of materials for making the organic encapsulating sub-layer IR include silicon nitride, silicon oxynitride, and silicon carbonitride, the adhesion force of acrylic and epoxy is about 2N to 3N. Various appropriate materials may be used for making the fourth transition sub-layer TL4. Examples of materials for making the fourth transition sub-layer TL4 include a material made by adding adhesion additives to silicon nitride or silicon oxynitride or changing deposition process parameters. In one example, adhesion of the fourth transition sub-layer TL4 is about 6N to 9N.

In another aspect, the present disclosure provides a method of fabricating an array substrate. In some embodiments, the method includes forming an auxiliary structure in an inter-subpixel region and on a base substrate; and forming a cathode layer on a side of the auxiliary structure away from the base substrate. Optionally, forming the auxiliary structure includes forming a plurality of groups of auxiliary blocks. A respective group of the plurality of groups of auxiliary blocks is formed to include one or more auxiliary blocks protruding away from the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. An array substrate, comprising:
a base substrate;

an auxiliary structure in an inter-subpixel region and on the base substrate;
a cathode layer on a side of the auxiliary structure away from the base substrate; and
a plurality of anodes comprising an anode of a first type, an anode of a second type, and an anode of a third type, having different shapes;
wherein the auxiliary structure comprises a plurality of groups of auxiliary blocks, a respective group of the plurality of groups of auxiliary blocks comprising one or more auxiliary blocks protruding away from the base substrate;
the plurality of groups of auxiliary blocks are configured to enhance adhesion between an organic layer and an adjacent layer and reduce or eliminate interlayer peeling therebetween
at least a first subpixel region corresponding to the anode of the first type and a second subpixel region corresponding to the anode of the second type have an elongated shape; and
the plurality of groups of auxiliary blocks are absent between longitudinal sides of the first subpixel region and the second subpixel region adjacent to each other.

2. The array substrate of claim 1, wherein the cathode layer comprises a plurality of groups of protrusions in the inter-subpixel region, a respective group of the plurality of groups of protrusions comprising one or more protrusions protruding away from the base substrate.

3. The array substrate of claim 2, wherein the respective group of the plurality of groups of protrusions is on a side of the respective group of the plurality of groups of auxiliary blocks away from the base substrate; and
an orthographic projection of the respective group of the plurality of groups of protrusions on the base substrate at least partially overlaps with an orthographic projection of the respective group of the plurality of groups of auxiliary blocks on the base substrate.

4. The array substrate of claim 1, wherein the one or more auxiliary blocks in the respective group of the plurality of groups of auxiliary blocks have a conforming shape.

5. The array substrate of claim 1, wherein a width of a respective auxiliary block, along a direction crossing over the respective auxiliary block, decreases from a side away from the base substrate to a side closer to the base substrate.

6. The array substrate of claim 1, wherein a lateral side of a respective auxiliary block has a slope angle with respect to a layer in contact with the respective auxiliary block in a range of 60 degrees to 80 degrees.

7. The array substrate of claim 1, further comprising a common organic layer on a side of the auxiliary structure away from the base substrate;
the common organic layer comprises a first part, a second part on a side of a respective auxiliary block away from the base substrate, and a third part;
the second part is at least partially segregated from the first part and the third part.

8. The array substrate of claim 1, wherein shapes of auxiliary blocks respectively in adjacent groups of auxiliary blocks in a same row are curved toward different directions; and
in a same column of groups of auxiliary blocks, shapes of auxiliary blocks respectively in adjacent groups of auxiliary blocks in the same column are curved toward a same direction.

9. The array substrate of claim 1, wherein shapes of auxiliary blocks in the auxiliary structure are curved toward a same direction.

10. The array substrate of claim 1, wherein auxiliary blocks of the auxiliary structure have a longitudinal shape;
longitudinal directions of the auxiliary blocks are substantially parallel to one of a first direction and a second direction, but not to the other one of the first direction and the second direction, the first direction and the second direction being different directions.

11. The array substrate of claim 1, wherein extension directions of auxiliary blocks of the auxiliary structure are substantially perpendicular to the longitudinal sides of the first subpixel region and the second subpixel region.

12. The array substrate of claim 1, further comprising a plurality of anodes;
wherein an orthographic projection of a respective group of the plurality of groups of auxiliary blocks on a base substrate at least partially overlaps with orthographic projection of an anode on the base substrate.

13. The array substrate of claim 1, further comprising a pixel definition layer;
wherein the plurality of groups of auxiliary blocks are on a side of the pixel definition layer away from the base substrate.

14. The array substrate of claim 13, further comprising a plurality of spacers on side of the pixel definition layer away from the base substrate;
an orthographic projection of the plurality of groups of auxiliary blocks on the base substrate is non-overlapping with an orthographic projection of the plurality of spacers on the base substrate.

15. The array substrate of claim 1, wherein the array substrate is a bendable array substrate configured to be bent along a bending direction;
auxiliary blocks in the auxiliary structure are arranged in a plurality of columns;
auxiliary blocks in a respective column of the plurality of columns are arranged in a direction substantially parallel to the bending direction; and
an extension direction of each auxiliary block is substantially perpendicular to the bending direction.

16. A display apparatus, comprising the array substrate of claim 1, and one or more integrated circuits connected to the array substrate.

17. An array substrate, comprising:
a base substrate;
an auxiliary structure in an inter-subpixel region and on the base substrate; and
a cathode layer on a side of the auxiliary structure away from the base substrate;
wherein the auxiliary structure comprises a plurality of groups of auxiliary blocks, a respective group of the plurality of groups of auxiliary blocks comprising one or more auxiliary blocks protruding away from the base substrate;
the plurality of groups of auxiliary blocks are configured to enhance adhesion between an organic layer and an adjacent layer and reduce or eliminate interlayer peeling therebetween;
the plurality of groups of auxiliary blocks are arranged in columns and rows;
groups of auxiliary blocks in adjacent rows are staggered; and
groups of auxiliary blocks in adjacent columns are staggered.

18. An array substrate, comprising:
a base substrate;
an auxiliary structure in an inter-subpixel region and on the base substrate;

a cathode layer on a side of the auxiliary structure away from the base substrate; and a plurality of anodes comprising an anode of a first type, an anode of a second type, and an anode of a third type, having different shapes;

wherein the auxiliary structure comprises a plurality of groups of auxiliary blocks, a respective group of the plurality of groups of auxiliary blocks comprising one or more auxiliary blocks protruding away from the base substrate;

the plurality of groups of auxiliary blocks are configured to enhance adhesion between an organic layer and an adjacent layer and reduce or eliminate interlayer peeling therebetween;

at least a first subpixel region corresponding to the anode of the first type and a second subpixel region corresponding to the anode of the second type have an elongated shape; and the plurality of groups of auxiliary blocks are present between longitudinal sides of the first subpixel region and the second subpixel region adjacent to each other.

19. The array substrate of claim 18, wherein extension directions of auxiliary blocks of the auxiliary structure are substantially parallel to the longitudinal sides of the first subpixel region and the second subpixel region.

* * * * *